United States Patent
Richter et al.

(10) Patent No.: US 10,797,109 B2
(45) Date of Patent: Oct. 6, 2020

(54) MICRO-STRUCTURED ORGANIC SENSOR DEVICE AND METHOD FOR MANUFACTURING SAME

(71) Applicant: Fraunhofer-Gesellschaft zur Förderung der angewandten Forschung e.V., Munich (DE)

(72) Inventors: Bernd Richter, Dresden (DE); Philipp Wartenberg, Dresden (DE); Karsten Fehse, Dresden (DE); Matthias Jahnel, Dresden (DE)

(73) Assignee: FRAUNHOFER-GESELLSCHAFT ZUR FÖRDERUNG DER ANGEWANDTEN FORSCHUNG E.V., Munich (DE)

( * ) Notice: Subject to any disclaimer, the term of this patent is extended or adjusted under 35 U.S.C. 154(b) by 0 days.

(21) Appl. No.: 16/381,053

(22) Filed: Apr. 11, 2019

(65) Prior Publication Data

US 2019/0237512 A1 Aug. 1, 2019

Related U.S. Application Data

(63) Continuation of application No. PCT/EP2017/076192, filed on Oct. 13, 2017.

(30) Foreign Application Priority Data

Oct. 14, 2016 (DE) .......... 10 2016 220 086

(51) Int. Cl.
*H01L 29/08* (2006.01)
*H01L 27/30* (2006.01)
(Continued)

(52) U.S. Cl.
CPC ........ *H01L 27/305* (2013.01); *B81C 1/00246* (2013.01); *H01L 27/307* (2013.01);
(Continued)

(58) Field of Classification Search
CPC . H01L 27/305; H01L 27/307; H01L 51/0003; H01L 51/442; H01L 51/448; B81C 1/00246
See application file for complete search history.

(56) References Cited

U.S. PATENT DOCUMENTS

| 8,441,001 B2 | 5/2013 | Furst et al. |
| 2004/0056180 A1 | 3/2004 | Yu |

(Continued)

FOREIGN PATENT DOCUMENTS

| DE | 10 2006 049 120 A1 | 4/2008 |
| GB | 2 427 308 A | 12/2006 |

(Continued)

OTHER PUBLICATIONS

International Search Report dated Jan. 30, 2019, issued in application No. PCT/EP2017/076192.
(Continued)

*Primary Examiner* — Phuc T Dang
(74) *Attorney, Agent, or Firm* — McClure, Qualey & Rodack, LLP

(57) ABSTRACT

A micro-structured organic sensor device which has the following layers oriented in parallel to one another:
a substrate layer for supporting the further layers;
an organic sensor layer for converting a technical quantity to be detected to an electrical quantity;
a first electrode layer for contacting the organic sensor layer on a side of the organic sensor layer facing the substrate layer;
a second electrode layer for contacting the organic sensor layer on a side of the organic sensor layer facing away from the substrate layer; and
one or several functional layers;
wherein the sensor layer is structured such that a plurality of horizontally spaced sensor segments are formed;
(Continued)

wherein at least one of the electrode layers is structured such that a plurality of horizontally spaced electrode segments are formed so that at least one of the electrode segments of the respective electrode layer is associated to each of the sensor segments; and wherein the one or several functional layers at least partly fill gaps located horizontally between the sensor segments.

19 Claims, 15 Drawing Sheets

(51) Int. Cl.
    *H01L 51/00*     (2006.01)
    *B81C 1/00*     (2006.01)
    *H01L 51/44*     (2006.01)

(52) U.S. Cl.
    CPC ........ *H01L 51/0003* (2013.01); *H01L 51/442* (2013.01); *H01L 51/448* (2013.01); *B81B 2201/0292* (2013.01); *B81C 2203/0771* (2013.01)

(56) References Cited

U.S. PATENT DOCUMENTS

| | | |
|---|---|---|
| 2010/0014100 A1* | 1/2010 | Yang ...................... G08C 23/04 356/614 |
| 2014/0036168 A1 | 2/2014 | Ludwig |
| 2014/0167749 A1* | 6/2014 | Kim ......................... G01V 3/40 324/251 |
| 2016/0172595 A1 | 6/2016 | Malinowski et al. |
| 2017/0322647 A1* | 11/2017 | Katsuhara ............. H03K 17/96 |

FOREIGN PATENT DOCUMENTS

| | | |
|---|---|---|
| WO | 2007/017474 A1 | 2/2007 |
| WO | 2008/046789 A2 | 4/2008 |

OTHER PUBLICATIONS

Kang, N.S., et al.; "Partitioning of the organic layers for the fabrication of high efficiency organic photovoltaic devices;" Organic Electronics; May 2009; vol. 10; No. 6; pp. 1091-1096.

Han, M.G., et al.; "Narrow-Band Organic Photodiodes for High-Resolution Imaging;" Applied Materials & Interfaces; vol. 8; No. 39; Sep. 2016; pp. 26143-26151.

* cited by examiner

MICRO-STRUCTURED ORGANIC SENSOR DEVICE AND METHOD FOR MANUFACTURING SAME

CROSS-REFERENCE TO RELATED APPLICATIONS

This application is a continuation of copending International Application No. PCT/EP2017/076192, filed Oct. 13, 2017, which is incorporated herein by reference in its entirety, and additionally claims priority from German Application No. 102016220086.0, filed Oct. 14, 2016, which is also incorporated herein by reference in its entirety.

BACKGROUND OF THE INVENTION

The invention relates to organic sensor devices and to methods for manufacturing same. A sensor device is known from DE 10 2006 049 120 A1, wherein an organically based sensor-activated layer is arranged between a bottom electrode and a top electrode.

SUMMARY

According to an embodiment, a micro-structured organic sensor device may have the following layers oriented in parallel to one another: a substrate layer for supporting the further layers; an organic sensor layer for converting a technical quantity to be detected to an electrical quantity; a first electrode layer for contacting the organic sensor layer on a side of the organic sensor layer facing the substrate layer; a second electrode layer for contacting the organic sensor layer on a side of the organic sensor layer facing away from the substrate layer; and one or several functional layers; wherein the sensor layer is structured such that a plurality of horizontally spaced sensor segments are formed; wherein at least one of the electrode layers is structured such that a plurality of horizontally spaced electrode segments are formed so that at least one of the electrode segments of the respective electrode layer is associated to each of the sensor segments; and wherein the one or several functional layers at least partly fill gaps located horizontally between the sensor segments; and wherein one or several light-emitting diodes is/are formed on the substrate layer.

According to another embodiment, a method for manufacturing a micro-structured organic sensor device having layers oriented in parallel to one another, wherein the layers have a sensor layer which is structured such that a plurality of horizontally spaced sensor segments are formed, wherein each sensor segment consists of one or several regions, in particular in accordance with the above inventive sensor device, may have the following steps in the following order: a) providing a substrate layer for supporting the further layers, wherein a first electrode layer for contacting an organic sensor layer is arranged at the substrate layer, for converting a technical quantity to be detected to an electrical quantity; b) applying at least one organic sensor material layer over an entire area onto a compound made of the substrate layer and the first electrode layer; c) applying a first photoresist layer over an entire area onto the organic sensor material layer; d) selectively exposing the first photoresist layer so that a first cured photoresist structure having horizontally spaced first cured photoresist structure elements and a first non-cured photoresist structure result; e) removing the first non-cured photoresist structure by means of a first developing solvent; f) applying a first solvent in order to remove a part of the at least one organic sensor material layer not covered by the first cured photoresist structure so that at least one of the regions of the sensor segments of the sensor layer is formed each by a remaining part of the at least one organic sensor material layer so that each of the sensor segments is contacted by the first electrode layer; g) removing the first cured photoresist structure by means of a second solvent; h) applying a second photoresist layer over an entire area onto the sensor segments and onto gaps located horizontally between the sensor segments; i) selectively exposing the second photoresist layer so that a second cured photoresist structure having horizontally spaced second cured photoresist structure segments and a second non-cured photoresist structure result, wherein at least one of the second cured photoresist structure segments is formed at each sensor segment; j) removing the second non-cured photoresist structure by means of a second developing solvent; k) applying a functional layer over an entire area onto the sensor segments having the second cured photoresist structure segments and the gaps located horizontally between the sensor segments; l) applying a third photoresist layer over an entire area onto the functional layer (6); m) selectively exposing the third photoresist layer so that a third cured photoresist layer and a third non-cured photoresist layer having horizontally spaced non-cured photoresist structure segments result, wherein one of the non-cured photoresist structure segments of the third photoresist layer is associated to each of the second cured photoresist structure segments; n) removing the third non-cured photoresist structure by means of a third developing solvent; o) applying a third solvent in order to remove a part of the functional layer not covered by the third cured photoresist structure and the second cured photoresist structure segments so that the functional layer is structured such that the gaps located horizontally between the sensor segments are filled at least partly by the functional layer; p) removing the third cured photoresist structure by means of a fourth solvent; and q) applying a second electrode layer for contacting the organic sensor layer over an entire area onto the sensor segments and the functional layer so that each of the sensor segments is contacted by the second electrode layer; wherein at least one of the electrode layers is structured such that a plurality of horizontally spaced electrode segments are formed so that at least one of the electrode segments of the respective electrode layer is associated to each of the sensor segments.

According to still another embodiment, a method for manufacturing a micro-structured organic sensor device having layers oriented in parallel to one another, wherein the layers have a sensor layer which is structured such that a plurality of horizontally spaced sensor segments are formed, wherein each sensor segment consists of one or several regions, in particular in accordance with the above inventive sensor device, may have the following steps in the following order: a) providing a substrate layer for supporting the further layers, wherein a first electrode layer for contacting an organic sensor layer is arranged at the substrate layer, for converting a technical quantity to be detected to an electrical quantity; b) applying a first photoresist layer over an entire area onto a compound made of the substrate layer and the first electrode layer; c) selectively exposing the first photoresist layer so that a first cured photoresist structure and a first non-cured photoresist structure having first horizontally spaced cured photoresist structure segments are formed; d) removing the first non-cured photoresist structure by means of a first developing solvent; e) applying an organic sensor material layer over an entire area onto a compound made of the substrate layer, the first electrode layer and the first cured photoresist structure; f) applying a first solvent in order to remove the first cured photoresist structure and the part of the organic sensor material layer arranged thereon so that at least one of the regions of the sensor segments of the sensor layer is formed each by a remaining part of the at least one organic sensor material layer so that each of the sensor segments is contacted by the first electrode layer; g) applying a second photoresist layer over an entire area onto a compound made of the substrate layer, the first electrode layer and the sensor segments; h) selectively exposing the second photoresist layer so that a second cured photoresist structure having second horizontally spaced cured photoresist structure segments and a second non-cured photoresist structure result, wherein at least one cured photoresist structure segment of the second photoresist layer is formed at each sensor segment; i) removing the second non-cured photoresist structure by means of a second developing solvent; j) applying a functional layer over an entire area onto the sensor segments having the cured photoresist structure segments of the second photoresist layer and the gaps located horizontally between the sensor segments; k) applying a second solvent in order to remove the second cured photoresist structure and the part of the functional layer arranged thereon so that the functional layer is structured such that the gaps located horizontally between the sensor segments are filled at least partly by the functional layer; and l) applying a second electrode layer for contacting the organic sensor layer over an entire area onto the sensor segments and the functional layer, wherein each of the sensor segments is contacted by the second electrode layer; wherein at least one of the electrode layers is structured such that a plurality of horizontally spaced electrode segments are formed so that at least one of the electrode segments of the respective electrode layer is associated to each of the sensor segments.

The object is achieved by a micro-structured organic sensor device which comprises the following layers which are oriented in parallel to one another:

a substrate layer for supporting the further layers;

an organic sensor layer for converting a technical quantity to be detected to an electrical quantity;

a first electrode layer for contacting the organic sensor layer on a side of the organic sensor layer facing the substrate layer;

a second electrode layer for contacting the organic sensor layer on a side of the organic sensor layer facing away from the substrate layer; and one or several functional layers;

wherein the sensor layer is structured such that a plurality of horizontally spaced sensor segments are formed;

wherein at least one of the electrode layers is structured such that a plurality of horizontally spaced electrode segments are formed so that at least one of the electrode segments of the respective electrode layer is associated to each of the sensor segments; and wherein the one or the several functional layers at least partly fill gaps located horizontally between the sensor segments.

The terms horizontal, top, bottom in this document relate to a normal position of the micro-structured organic sensor device where the substrate layer is arranged to be the lowest layer in parallel to the earth's surface.

When compared to using an inorganic sensor layer, using an organic sensor layer exhibits several advantages. The organic sensor layer may be applied easily on the underlying layers by means of full-area spin-coating, by different full-area liquid-phase processes or by thermal evaporation processes, wherein the result is direct electrical contacting so that bump contacts which are complicated to manufacture and, in particular in the case of thermal stress, are prone to errors may be dispensed with. Apart from increased functional security, considerable cost savings result. In addition, the methods mentioned can usually be performed at temperatures of below 80° C. so that the underlying layers may also consist of materials which are temperature-sensitive.

In addition, organic materials for sensor applications are available in considerably higher numbers so that the performance of the sensor device can be optimized by specifically selecting the materials of the sensor layer.

Furthermore, an organic sensor layer may be arranged above drive and read-out electronics integrated in a chip, which is not possible in an inorganic sensor layer since in this case the drive and read-out electronics has to be arranged in the plane of the inorganic sensor layer. This allows realizing an increased fill factor, the fill factor indicating the portion of sensorically active area in relation to the overall area of the plane so that, in the end, a more compact and more sensitive sensor device can be realized. In addition, means for concentrating the effect of the technical quantity to be detected on the sensorically active area can be dispensed with. In the case of an optical sensor device, for example, when using an organic sensor layer, microlenses, conventionally used in inorganic sensor layers, for focusing incident light onto the sensorically active area can be dispensed with.

The electrical quantity may, for example, be a voltage, current or electrical resistance. Each sensor segment here is configured to provide a value of the electrical quantity which ideally does not depend on the values of the electrical quantity provided by the other sensor segments. This means that the sensor segments function as individual sensors. Each sensor segment here is electrically connected to, that is contacts, both the first electrode layer and the second electrode layer so that the values provided can be read out via the first electrode layer and the second electrode layer.

The values of the electrical quantity provided by the sensor segments may be read out independently since at least one of the electrode layers is structured such that a plurality of horizontally spaced electrode segments are formed, wherein each of the sensor segments is connected electrically to at least one associated electrode segment which is not connected electrically to any of the other sensor segments. This means that the electrode segments here function as individual electrodes for an individual sensor.

The first electrode layer here may be structured and the second electrode layer may be unstructured. However, the reverse case is also possible where the first electrode layer is unstructured and the second electrode layer is structured. The respective unstructured electrode layer functions as a common electrode for all the sensors.

Additionally, it is also possible for both electrode layers to be structured. In this case, no common electrode has to be provided.

In the present invention, lithographic methods may exemplarily be used for structuring the sensor layer at high precision. Lithographic methods may also be used for producing the one or several functional layers. In such lithographic methods, fluorinated photoresists which do not attack sensitive organic materials may also be used.

When compared to the sensor device of DE 10 2006 049 120 A1 having an unstructured sensor layer, crosstalk or cross-coupling between the sensor segments is reduced strongly by structuring the sensor layer such that a plurality of horizontally spaced sensor segments are formed.

Crosstalk or cross-coupling effects are further reduced by the fact that the one or several functional layers at least partly fill gaps located horizontally between the sensor segments.

The functional layer may completely or partly cover the sensor layer in a vertical and/or horizontal way.

In accordance with an advantageous further development of the invention, the sensor segments comprise a maximum horizontal extension of smaller than 50 µm.

Structuring and filling the gaps are of considerable advantage, in particular with increasing miniaturization, in particular in the µm and sub-µm ranges, since the influence of crosstalk or cross-coupling effects between the individual sensors increases with increasingly smaller individual sensors. The functional layer may then also be structured in a range of smaller than 50 µm.

In accordance with a practical further development of the invention, the one or several functional layers comprise a passivation layer. A passivation layer here is understood to be a layer which prevents electrical and/or electromagnetic processes. This may, for example, be an electrical passivation layer which prevents undesired electrical currents. This may, however, also be an electromagnetic passivation layer which prevents undesired electromagnetic radiation. Passivation layers fulfilling both functions mentioned are of course also possible.

In accordance with an advantageous further development of the invention, the organic sensor layer comprises several sub-sensor layers arranged in parallel to the other layers. These may, for example, be sub-sensor layers at the transition of which there is a pn junction.

In accordance with an advantageous further development of the invention, the sensor segments are arranged in the style of a two-dimensional matrix. In particular in a matrix made of organic individual sensors, crosstalk or cross-coupling effects between the individual sensors can be reduced considerably when the individual sensors are structured and additionally the gaps between the individual sensors are filled at least partly by one or several functional layers.

In accordance with a practical further development of the invention, the first and/or second electrode layers is/are implemented as an organic layer, metal layer or metal-oxide multi-layer.

In accordance with a practical further development of the invention, the substrate layer is implemented as a glass layer, plastics layer or silicon layer.

The substrate layer may be implemented to be rigid or flexible and/or contain active devices and/or one or several wiring planes. This includes glass or plastic substrates having active TFT transistors or silicon wafers with active devices, for example.

In accordance with an advantageous further development of the invention, the sensor segments are optical sensor segments so that the micro-structured organic sensor device is a micro-structured optical organic sensor device.

The invention is particularly suitable for micro-structured optical organic sensor devices. The micro-structured optical sensor segments may be applied onto most different substrate layers. In particular the combination with TFT or CMOS substrates allows manufacturing novel and high-performance optical sensor devices. The setup of the organic sensor segments may be configured for different wavelength ranges (UV/VIS/NIR). Here, micro-structuring of the optical organic sensor layer and the other inorganic or organic layers may, for example, be realized by means of lithography. The optical sensor segments may particularly be photodiodes.

The invention can generally be used for manufacturing optical sensor devices in the ultraviolet, visible up to infrared spectral ranges. Such sensor devices can be used in particular in security and military technology, in particular as NIR or IR sensors, in meteorology technology, in particular as UV sensors, in food and agricultural technology, in particular as NIR sensors, in quality management and the automobile sector, in particular as NIR sensors, in camera technology, in particular in the visible spectral range, and in hyper-spectral recording technology.

In accordance with a practical further development of the invention, the first and/or second electrode layers is/are transparent or semi-transparent.

A transparent electrode layer can be understood to be such an electrode layer which transmits at least 90% of incident light. Furthermore, a semi-transparent electrode layer can be understood to be such an electrode layer which transmits at least 50% of incident light.

When the first electrode layer is transparent or semi-transparent, light incidence onto the organic sensor layer may be through the substrate layer. When, however, the second electrode layer is transparent or semi-transparent, light incidence may be from the side facing away from the substrate.

In accordance with a practical further development of the invention, a group of sensor segments comprises a spectral sensitivity and at least one further group of sensor segments comprises a spectral sensitivity which is each deviating from the spectral sensitivities of the other groups.

The sensor segments of the first spectral sensitivity and the sensor segments of the second spectral sensitivity here may be read out separately and consequently allow spectral differentiation (like UV/VIS/NIR) without using additional filters.

In accordance with an advantageous further development of the invention, the sensor segments comprise a region having a spectral sensitivity and at least one further region having a deviating spectral sensitivity.

Using sub-structured sensor segments allows realizing particularly broad-band optical sensor devices. Such broad-band optical sensor devices allow hyper-spectral recording. Hyper-spectral recording means recordings generated by plotting a very large number of wavelengths located closely to one another.

In accordance with a practical further development of the invention, one or several light-emitting diodes are implemented on the substrate layer.

At least one light-emitting diode, at least one one-dimensional light-emitting diode arrangement or at least one two-dimensional light-emitting diode arrangement, light-emitting diode array, each having one or several emitters, may be arranged on the substrate layer. Sensor segments and light-emitting diodes may, for example, be arranged next to one another, in an interleaved or any other way.

In this way, the sensor device becomes a multi-functional device which, apart from the sensor function, may also exhibit an illumination function.

In accordance with an advantageous further development of the invention, the layers comprise one or several light-coupling layers which are configured for improving the light-coupling efficiency when coupling light into one of the electrode layers and/or coupling light out from one of the electrode layers, wherein one of the light-coupling layers is each provided on the side of the first electrode layer facing away from the organic sensor layer and/or on the side of the second electrode layer facing away from the organic sensor layer.

Such a light-coupling layer can provide for light-coupling into and out from the electrode layers for the wavelength range used. In addition, such a light-coupling layer may comprise a further function as a buffer layer for reducing layer tension relative to adjacent layers.

The light-coupling layers may cause an improvement in light-coupling efficiency by suitable shaping and/or by using materials having a suitable index of refraction. In particular, they can be implemented so as to avoid total light reflection.

In accordance with a practical further development of the invention, the layers comprise one or several filter layers configured for spectrally filtering light when coupling light into one of the electrode layers and/or when coupling light out from one of the electrode layers, wherein one of the filter layers is provided each on the side of the first electrode layer facing away from the organic sensor layer and/or on the side of the second electrode layer facing away from the organic sensor layer.

Here, structured and/or unstructured optical filter layers (like absorption, interference or plasmon filters, for example) may be applied between the substrate layer and the first electrode layer and/or on the second electrode layer. Optionally, a buffer layer may be employed between the respective filter layer and the respective electrode layer.

The sensor device can be modified relative to its spectral characteristics by such optical filter layers. Absorption and interference filters can be employed so as to provide the sensor device with a tightly limited spectral sensitivity.

In accordance with a practical further development of the invention, the one or several filter layers are structured such that a plurality of filter segments located horizontally next to one another are formed so that at least one of the filter segments of the respective filter layer is associated to each of the sensor segments, wherein a first group of the filter segments of the respective filter layer comprises a first spectral characteristic and a second group of the filter segments of the respective filter layer comprises a second spectral characteristic deviating from the first spectral characteristic.

This allows specifically influencing the spectral sensitivities of the sensor segments.

In accordance with a practical further development of the invention, a thin-film encapsulation is provided for protecting at least a part of the layers from the effects of humidity.

The thin-film encapsulation may be applied on the top and/or bottom side of the device and may exemplarily contain ALD, CVD, Vitex, VTE, PVD or combinations thereof. The thin-layer encapsulation may be applied with or without a buffer layer.

In accordance with a practical further development of the invention, the thin-layer encapsulation is configured for preventing liquid from penetrating horizontally between at least some of the layers.

The thin-layer encapsulation here may be structured such that only sensitive regions are covered and lateral diffusion/migration of, for example, water is prevented or minimized.

In accordance with an advantageous further development of the invention, at least one of the layers is dried by means of flash-lamp annealing or exposing during manufacturing.

This allows achieving particularly quick drying of the respective layer. The organic sensor layer which is produced from materials deposited in liquid phase, the filter layer or the thin-layer encapsulation, for example, can be dried by means of flash-lamp annealing.

Flash-lamp annealing can heat up thin layers locally for a very short time without damaging the underlying substrate (CMOS, foil, paper). Using this technology, it is potentially possible to combine organic materials with underlying layers which up to now could not be united due to their strongly opposite thermal stress.

A filter layer, for example, can be annealed without destroying an underlying organic sensor layer, even if the filter layer is, for a short time, brought to a temperature which is higher than the maximum temperature allowable for the organic sensor layer.

Flash-lamp annealing can be done by means of individual pulses or by means of pulse sequences of illumination times of less than 1 s so that the thermal stress for the layer to be produced and the layers produced before can be kept small.

In addition, the object is achieved by a method for manufacturing a micro-structured organic sensor device comprising layers oriented in parallel to one another, the layers comprising a sensor layer which is structured such that a plurality of horizontally spaced sensor segments are formed, each sensor segment consisting of one or several regions, in particular in accordance with the above inventive sensor device, the method comprising the following steps in the following order:

a) providing a substrate layer for supporting the further layers, wherein a first electrode layer for contacting an organic sensor layer is arranged at the substrate layer, for converting a technical quantity to be detected to an electrical quantity;

b) applying at least one organic sensor material layer over an entire area onto a compound made of the substrate layer and the first electrode layer 4;

c) applying a first photoresist layer over an entire area onto the organic sensor material layer;

d) selectively exposing the first photoresist layer so that a first cured photoresist structure having horizontally spaced first cured photoresist structure elements and a first non-cured photoresist structure result;

e) removing the first non-cured photoresist structure by means of a first developing solvent;

f) applying a first solvent in order to remove a part of the at least one organic sensor material layer not covered by the first cured photoresist structure so that at least one of the regions of the sensor segments of the sensor layer is formed each by a remaining part of the at least one organic sensor material layer so that each of the sensor segments is contacted by the first electrode layer;

g) removing the first cured photoresist structure by means of a second solvent;

h) applying a second photoresist layer over an entire area onto the sensor segments 7 and onto gaps located horizontally between the sensor segments;

i) selectively exposing the second photoresist layer so that a second cured photoresist structure having horizontally spaced second cured photoresist structure segments and a second non-cured photoresist structure result, wherein at least one of the second cured photoresist structure segments is formed at each sensor segment;

j) removing the second non-cured photoresist structure by means of a second developing solvent;

k) applying a functional layer over an entire area onto the sensor segments having the second cured photoresist structure segments and the gaps located horizontally between the sensor segments;

l) applying a third photoresist layer over an entire area onto the functional layer;

m) selectively exposing the third photoresist layer so that a third cured photoresist layer and a third non-cured photoresist layer having horizontally spaced noncured photon resist structure segments result, wherein one of the noncured photoresist structure segments of the third photoresist layer is associated to each of the second cured photoresist structure segments;

n) removing the third noncured photoresist structure by means of a third developing solvent;

o) applying a third solvent in order to remove a part of the functional layer not covered by the third cured photoresist structure and the second cured photoresist structure segments so that the functional layer is structured such that the gaps located horizontally between the sensor segments are filled at least partly by the functional layer;

p) removing the third cured photoresist structure by means of a fourth solvent; and q) applying a second electrode layer for contacting the organic sensor layer over an entire area onto the sensor segments and the functional layer so that each of the sensor segments is contacted by the second electrode layer;

wherein at least one of the electrode layers is structured such that a plurality of horizontally spaced electrode segments are formed so that at least one of the electrode segments of the respective electrode layer is associated to each of the sensor segments.

In another aspect, the object is achieved by a method for manufacturing a micro-structured organic sensor device comprising layers oriented in parallel to one another, the layers comprising a sensor layer which is structured such that a plurality of horizontally spaced sensor segments are formed, each sensor segment consisting of one or several regions, in particular in accordance with the above inventive sensor device, the method comprising the following steps in the following order:

a) providing a substrate layer for supporting the further layers, wherein a first electrode layer for contacting an organic sensor layer is arranged at the substrate layer, for converting a technical quantity to be detected to an electrical quantity;

b) applying a first photoresist layer over an entire area onto a compound made of the substrate layer and the first electrode layer;

c) selectively exposing the first photoresist layer so that a first cured photoresist structure and a first non-cured photoresist structure having first horizon-tally spaced cured photoresist structure segments are formed;

d) removing the first non-cured photoresist structure by means of a first developing solvent;

e) applying an organic sensor material layer over an entire area onto a compound made of the substrate layer, the first electrode layer and the first cured photoresist structure;

f) applying a first solvent in order to remove the first cured photoresist structure and the part of the organic sensor material layer arranged thereon so that at least one of the regions of the sensor segments of the sensor layer is formed each by a remaining part of the at least one organic sensor material layer so that each of the sensor segments is contacted by the first electrode layer;

g) applying a second photoresist layer over an entire area onto a compound made of the substrate layer, the first electrode layer and the sensor segments;

h) selectively exposing the second photoresist layer so that a second cured photoresist structure having second horizontally spaced cured photoresist structure segments and a second non-cured photoresist structure result, wherein at least one cured photoresist structure segment of the second photoresist layer is formed at each sensor segment;

i) removing the second non-cured photoresist structure by means of a second developing solvent;

j) applying a functional layer over an entire area onto the sensor segments having the cured photoresist structure segments of the second photoresist layer and the gaps located horizontally between the sensor segments;

k) applying a second solvent in order to remove the second cured photoresist structure and the part of the functional layer arranged thereon so that the functional layer is structured such that the gaps located horizontally between the sensor segments are filled at least partly by the functional layer; and l) applying a second electrode layer for contacting the organic sensor layer over an entire area onto the sensor segments and the functional layer, wherein each of the sensor segments is contacted by the second electrode layer;

wherein at least one of the electrode layers is structured such that a plurality of horizontally spaced electrode segments are formed so that at least one of the electrode segments of the respective electrode layer is associated to each of the sensor segments.

BRIEF DESCRIPTION OF THE DRAWINGS

Embodiments of the present invention will be described below in greater detail referring to the drawings, in which.

DETAILED DESCRIPTION OF THE INVENTION

Figure 1:
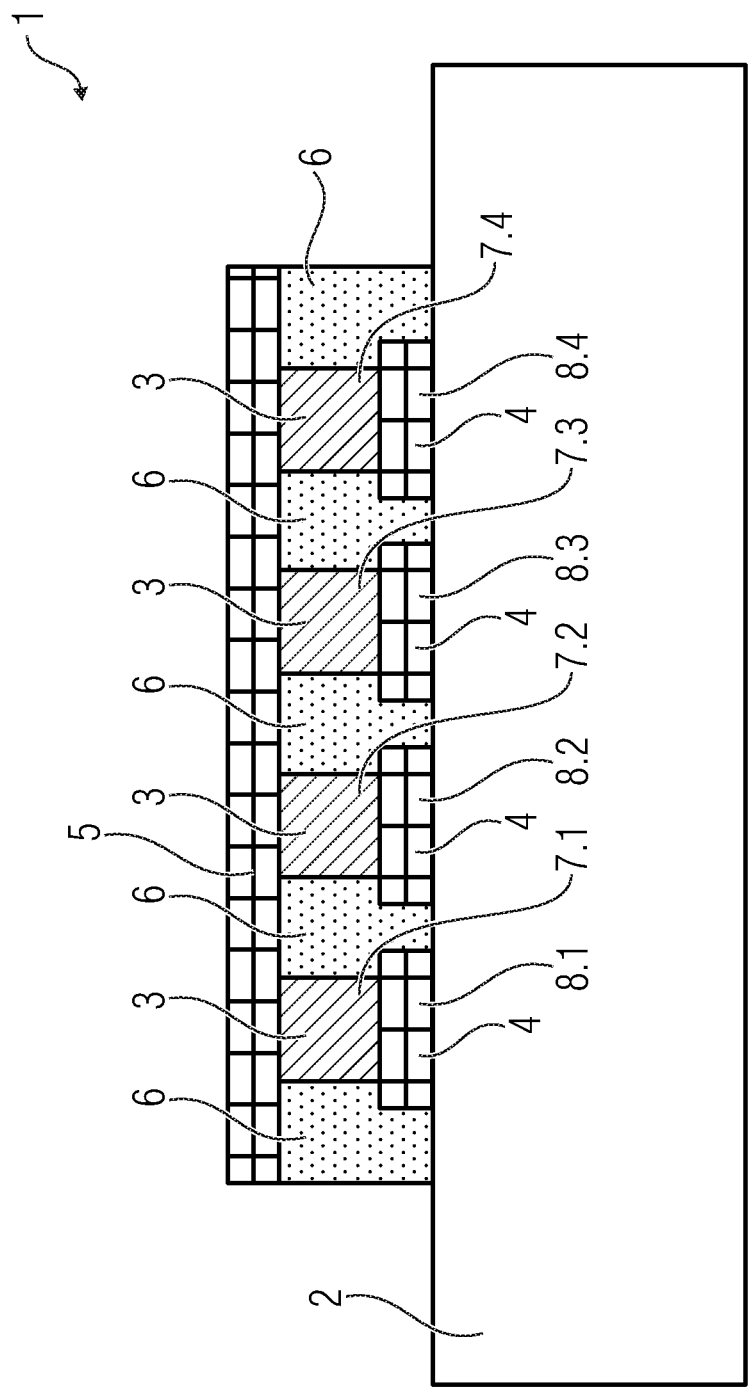
FIG. 1 shows a first embodiment of an inventive sensor device in a schematic side view.

Same elements or elements of the same kind or elements having the same or an equivalent function will be provided with same reference numerals or reference numerals of the same kind.

Embodiments comprising a plurality of characteristics of the present invention will be described below in greater detail so as to provide for an improved understanding of the invention. However, it is to be kept in mind that the present invention may also be realized while omitting certain characteristics described. It is to be pointed out that the characteristics shown in different embodiments may also be combined in different ways as long as this is not explicitly excluded or would not result to contradictions.

FIG. 1 shows, in a schematic side view, a first embodiment of an inventive micro-structured organic sensor device which comprises the following layers oriented in parallel to one another:

a substrate layer 2 for supporting the further layers;

an organic sensor layer 3 for converting a technical quantity to be detected to an electrical quantity;

a first electrode layer 4 for contacting the organic sensor layer 3 on a side of the organic sensor layer 3 facing the substrate layer 2;

a second electrode layer 5 for contacting the organic sensor layer 3 on a side of the organic sensor layer 3 facing away from the substrate layer 2; and one or several functional layers 6;

wherein the sensor layer 3 is structured such that a plurality of horizontally spaced sensor segments 7 are formed;

wherein at least one of the electrode layers 4, 5 is structured such that a plurality of horizontally spaced electrode segments 8 are formed so that at least one of the electrode segments 8 of the respective electrode layer 4, 5 is associated to each of the sensor segments 7; and wherein the one or several functional layers 5 at least partly fill gaps located horizontally between the sensor segments 7.

Thus, FIG. 1 exemplarily shows four sensor segments 7.1 to 7.4. In practice, however, the number thereof may be considerably higher, like several millions. The first electrode layer 4 is structured such that four electrode segments 8.1 to 8.4 are formed, wherein the electrode segment 8.1 is electrically connected to the sensor segment 7.1, the electrode segment 8.2 to the sensor segment 7.2, the electrode segment 8.3 to the sensor segment 7.3 and the electrode segment 8.4 to the sensor segment 7.3.

The second electrode layer 5 is unstructured and connected electrically to all the electrode segments 8.1 to 8.4.

In accordance with a further development of the invention, the sensor segments 7 comprise a maximum horizontal extension of smaller than 50 µm.

In accordance with a practical further development of the invention, the one or several functional layers 6 comprise a passivation layer 6.

In accordance with a practical further development of the invention, the organic sensor layer 3 comprises several sub-sensor layers arranged in parallel to the other layers (not shown in FIG. 1).

In accordance with a further embodiment of the invention, the sensor segments 7 are arranged in the style of a two-dimensional matrix.

In accordance with a practical further development of the invention, the first and/or the second electrode layers 4, 5 is/are implemented as organic layers, metal layers or metal-oxide multi-layers.

In accordance with a further embodiment of the invention, the substrate layer 2 is implemented as a glass layer, plastics layer or silicon layer.

In accordance with a practical further development of the invention, the sensor segments 7 are optical sensor segments 7 so that the micro-structured organic sensor device 1 is a micro-structured optical organic sensor device 1.

In accordance with a further development of the invention, the first and/or second electrode layers 4, 5 is/are transparent or semi-transparent.

In accordance with an advantageous further development of the invention, at least one of the layers is dried by means of flash-lamp annealing during manufacturing.

Figure 2:
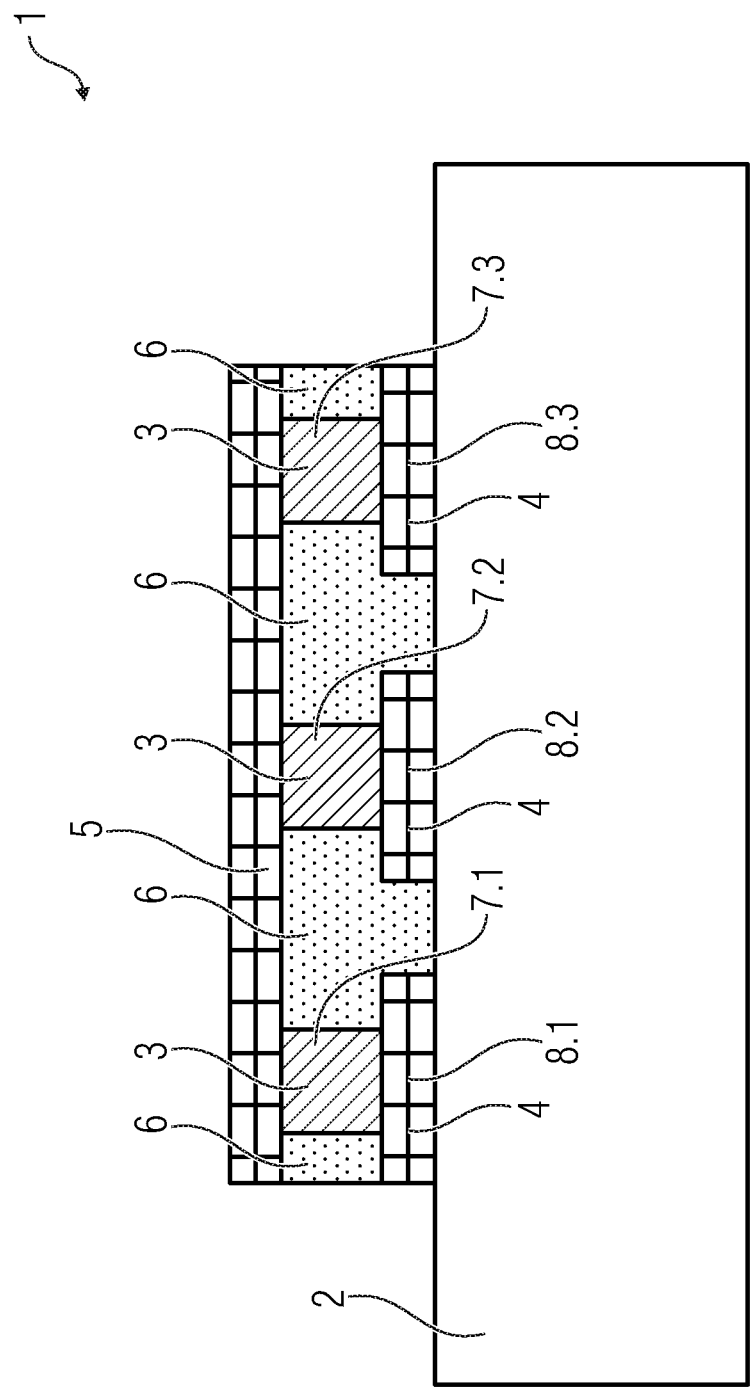
FIG. 2 shows a second embodiment of an inventive sensor device in a schematic side view.

FIG. 2 shows a second embodiment of an inventive sensor device 1 in a schematic side view. The embodiment of FIG. 2 is based on the embodiment of FIG. 1 so that only the differences will be described below. Thus, FIG. 2 exemplarily shows three sensor segments 7.1 to 7.3 and a first electrode layer 4 having three electrode segments 8.1 to 8.3.

In accordance with a practical embodiment of the invention, a group of the sensor segments 7 exhibits a spectral sensitivity SE (see FIG. 7) and at least one further group of the sensor segments 7 exhibits a spectral sensitivity SE differing each from the spectral sensitivities SE of the other groups.

In the embodiment of FIG. 2, the sensor segment 7.1 is associated to a first group having a spectral sensitivity SE1, the sensor segment 7.2 to a second group having a deviating spectral sensitivity SE2 and the sensor segment 7.3 to a third group having a in turn differently deviating spectral sensitivity SE3.

Figure 3:
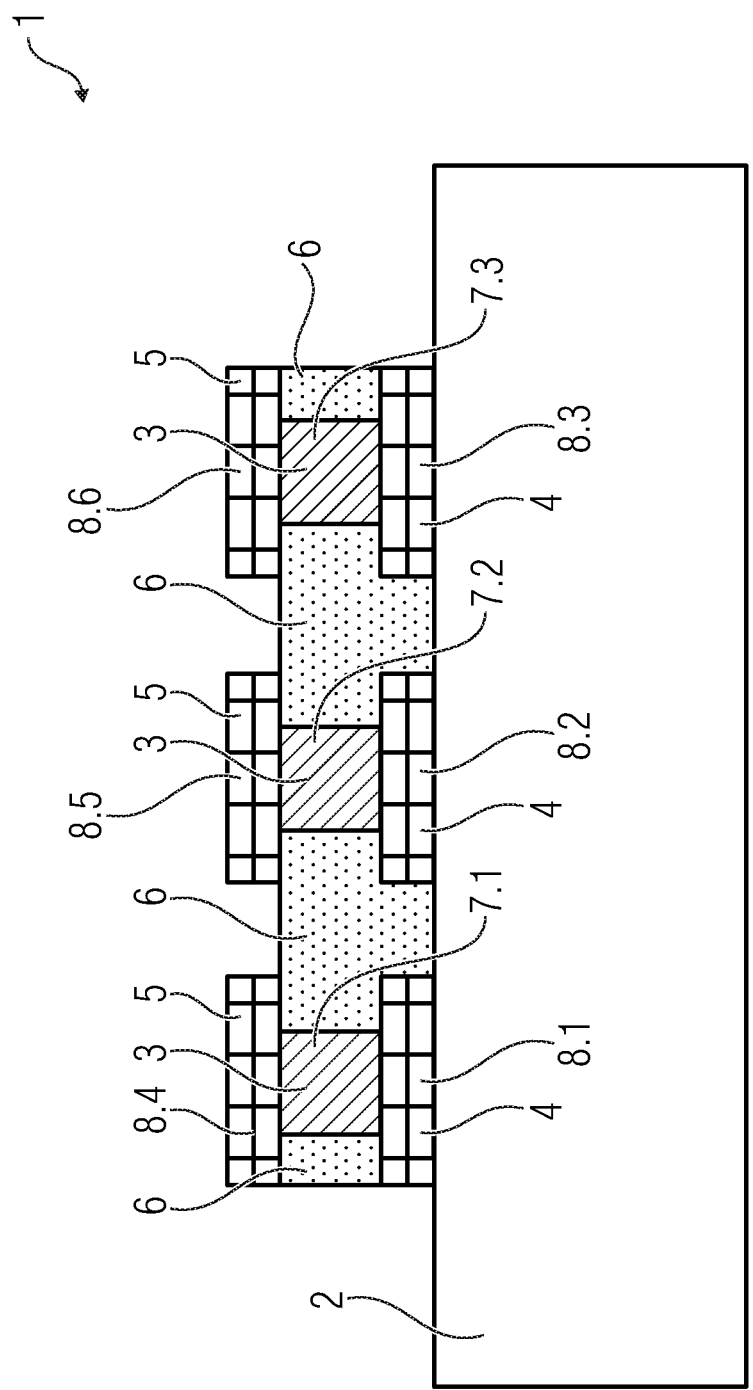
FIG. 3 shows a third embodiment of an inventive sensor device in a schematic side view.

FIG. 3 shows a third embodiment of an inventive sensor device 1 in a schematic side view. The embodiment of FIG. 3 is based on the embodiment of FIG. 2 so that only the differences will be described below. In the embodiment of FIG. 3, not only the first electrode layer 4, but also the second electrode layer 5 is structured so that the latter includes the electrode segments 8.4 to 8.5.

Figure 4:
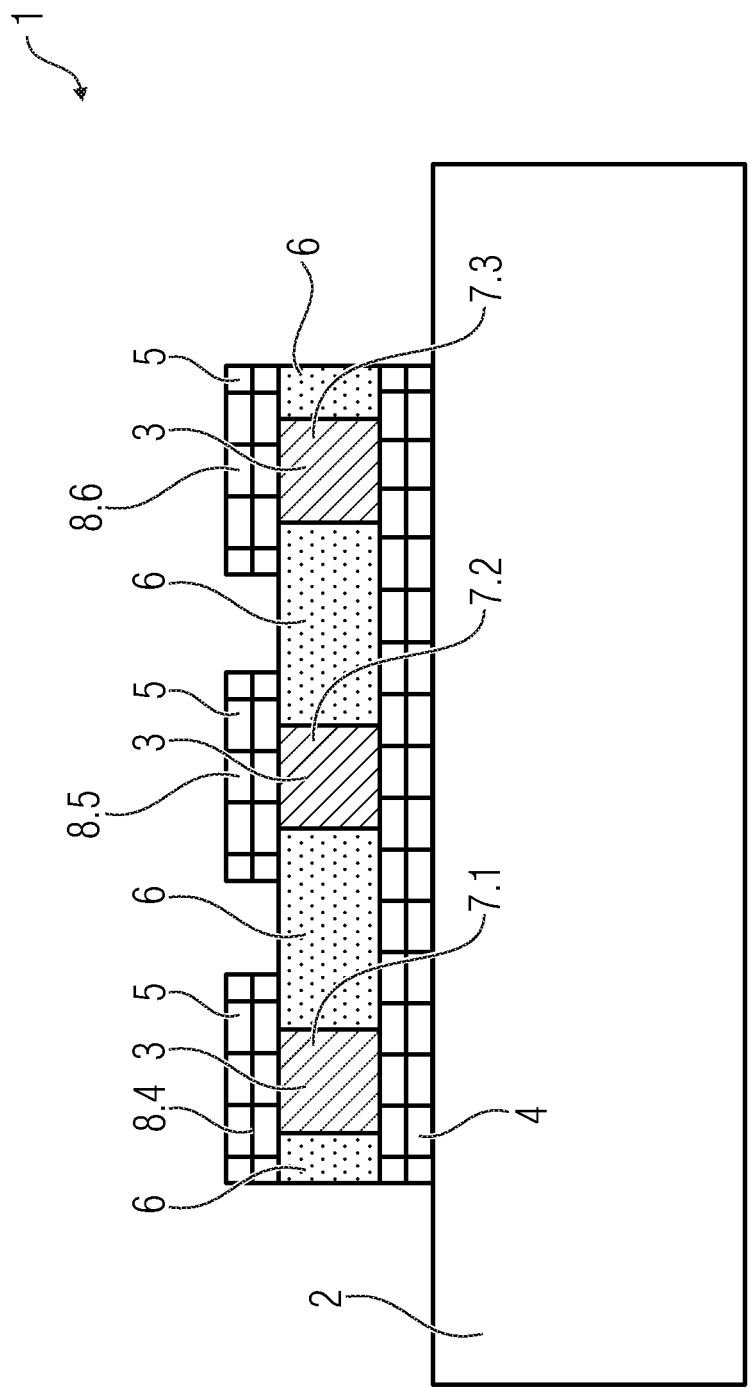
FIG. 4 shows a fourth embodiment of an inventive sensor device in a schematic side view.

FIG. 4 shows a fourth embodiment of an inventive sensor device 1 in a schematic side view. The embodiment of FIG. 4 is based on the embodiment of FIG. 3, which is why only the differences will be described below. In the embodiment of FIG. 4, the first electrode layer 4 is unstructured, whereas the second electrode layer 5 is structured, as is the case in the example of FIG. 3.

Figure 5:
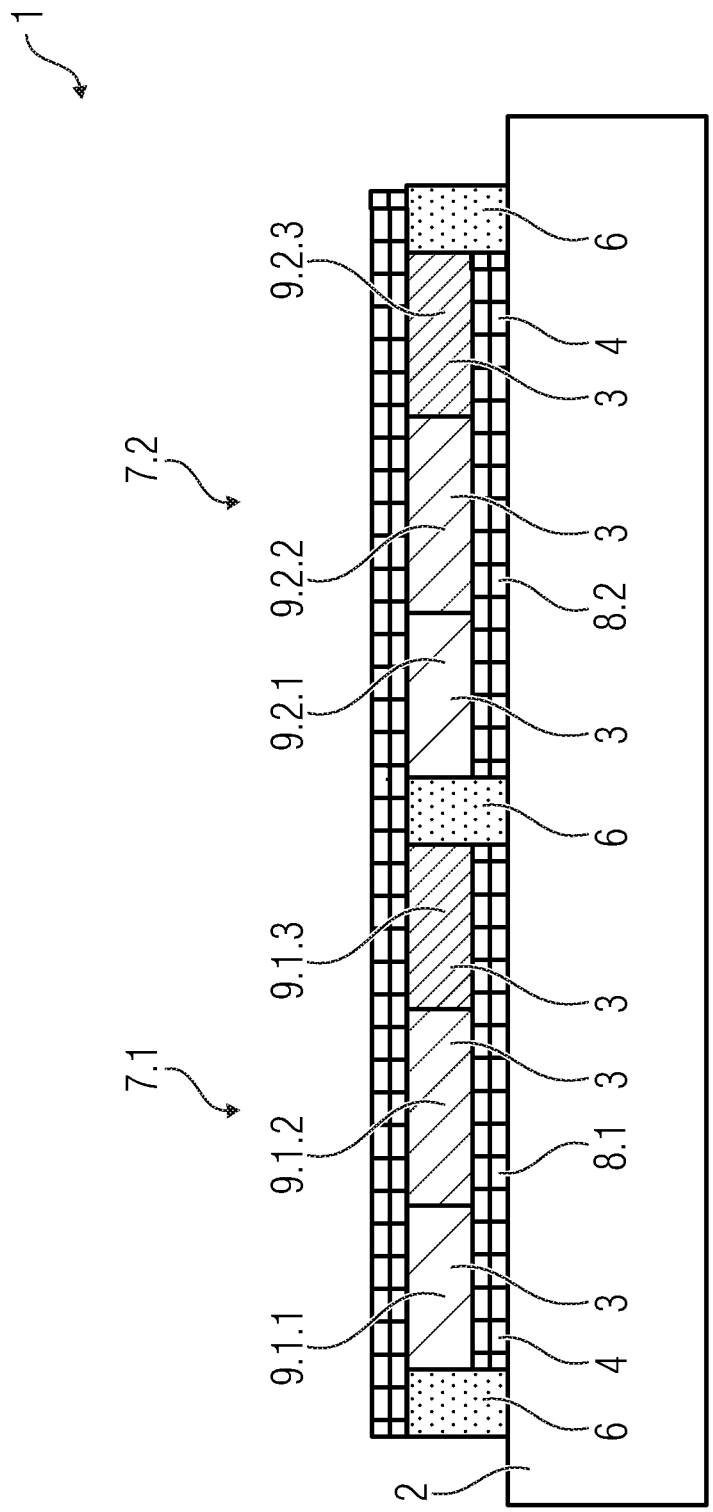
FIG. 5 shows a fifth embodiment of an inventive sensor device in a schematic side view.

FIG. 5 shows a fifth embodiment of an inventive sensor device 1 in a schematic side view. The embodiment of FIG. 5 is based on the previous embodiments. What is shown are, for example, two sensor segments 7.1 and 7.2 to which one of the electrode segments 8.1 and 8.2 of the structured first electrode layer 4 is associated each. However, the second electrode layer 5 is implemented to be unstructured.

In accordance with an advantageous further development of the invention, the sensor segments 7 comprise a region 9 having a spectral sensitivity SE and at least one further region 9 having a deviating spectral sensitivity SE.

In the embodiment of FIG. 5, the sensor segment 7.1 has a first region 9.1.1 having a spectral sensitivity SE1 (see FIG. 7), a second region 9.1.2 having a deviating spectral sensitivity SE2 and a third region 9.1.3 having a differently deviating spectral sensitivity SE3. In analogy, the sensor segment 7.2 comprises a first region 9.2.1 having a spectral sensitivity SE1, a second region 9.2.2 having a deviating spectral sensitivity SE2 and a third region 9.2.3 having a differently deviating spectral sensitivity SE3.

Figure 6:
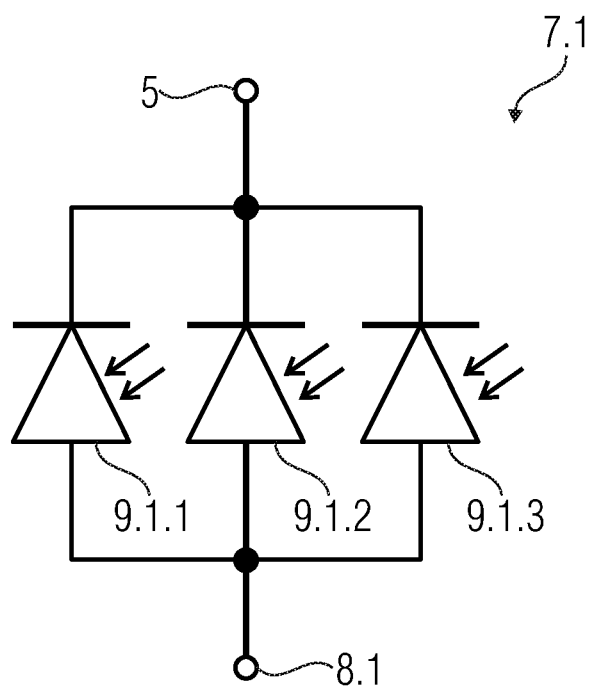
FIG. 6 shows an equivalent circuit diagram of a sensor segment of the fifth embodiment.

FIG. 6 shows an equivalent circuit diagram of a sensor segment 7.1 of the fifth embodiment. The first region 9.1.1 here is illustrated as the first photodiode 9.1.1, the second region 9.1.2 as the second photodiode 9.1.2 and the third region 9.1.3 as the third photodiode 9.1.3. The photodiodes 9.1.1 to 9.1.3 here are connected in parallel to the second electrode layer 5 and to the electrode segment 8.1 of the first electrode layer 4.

Figure 7:
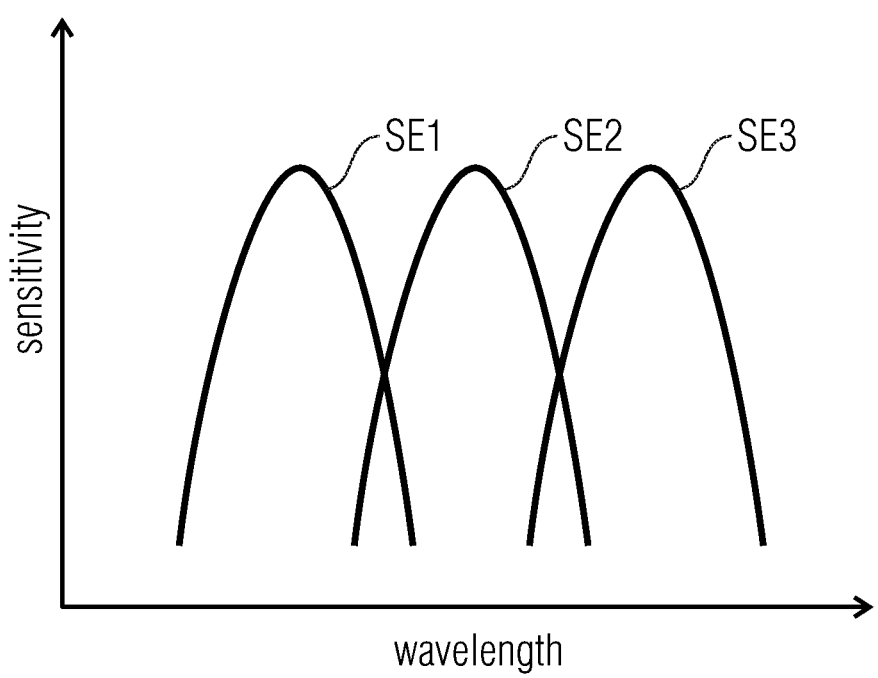
FIG. 7 shows a diagram for illustrating the spectral sensitivity of a sensor segment of the fifth embodiment.

FIG. 7 shows a diagram for illustrating the spectral sensitivity SE of a sensor segment 7 of the fifth embodiment. Spectral sensitivity SE here means the dependence of the sensitivity of the sensor segment SE in dependence on the wavelength of the radiation to be detected. As mentioned already, in the embodiment of FIG. 5, the sensor segment 7.1 comprises a first region 9.1.1 having a spectral sensitivity SE1, a second region 9.1.2 having a deviating spectral sensitivity SE2 and a third region 9.1.3 having a differently deviating spectral sensitivity SE3. In analogy, the sensor segment 7.2 comprises a first region 9.2.1 having a spectral sensitivity SE1, a second region 9.2.2 having a deviating spectral sensitivity SE2 and a third region 9.2.3 having a differently deviating spectral sensitivity SE3. The entire spectral sensitivity SE of the sensor segment 7.1 results by adding the spectral sensitivities SE1 to SE3 so that the sensor segment 7.1 is of a very broad-band nature.

FIGS. 8 to 11 show different embodiments of an inventive sensor device 1 in accordance with practical further developments of the invention, wherein one or several light-emitting diodes 10 are implemented each on the substrate layer 2.

Figure 8:
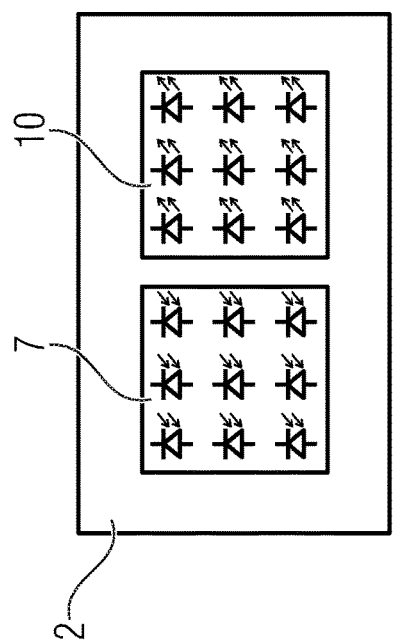
FIG. 8 shows a sixth embodiment of an inventive sensor device in a schematic top view.

FIG. 8 shows a sixth embodiment of an inventive sensor device 1 in a schematic top view. In the embodiment of FIG. 8, both the photodiodes 7 and the light-emitting diodes 10 are arranged in 3×3 matrices. Thus, Matrices consisting of photodiodes 7 and matrices consisting of light-emitting diodes 10 are alternating, wherein, for reasons of space, only one matrix consisting of photodiodes 7 and only one matrix consisting of light-emitting diodes 10 are shown.

Figure 9:
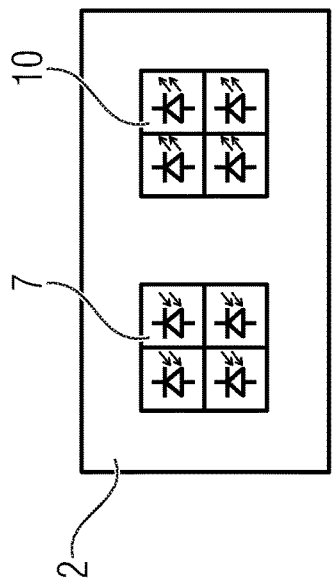
FIG. 9 shows a seventh embodiment of an inventive sensor device in a schematic top view.

FIG. 9 shows a seventh embodiment of an inventive sensor device 1 in a schematic top view. The embodiment of FIG. 9 is based on the embodiment of FIG. 8, wherein, however, the photodiodes 7 and the light-emitting diodes 10 are arranged in 2×2 matrices.

Figure 10:
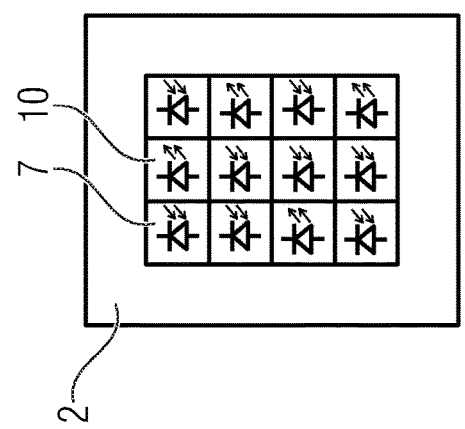
FIG. 10 shows an eighth embodiment of an inventive sensor device in a schematic top view.

FIG. 10 shows an eighth embodiment of an inventive sensor device 1 in a schematic top view. Here, the photodiodes 7 and the light-emitting diodes 10 are arranged alternatingly in a common matrix. What is shown here is a common 4×4 matrix. It is a matter of fact that the matrix may also be greater or that several such matrices may be provided.

Figure 11:
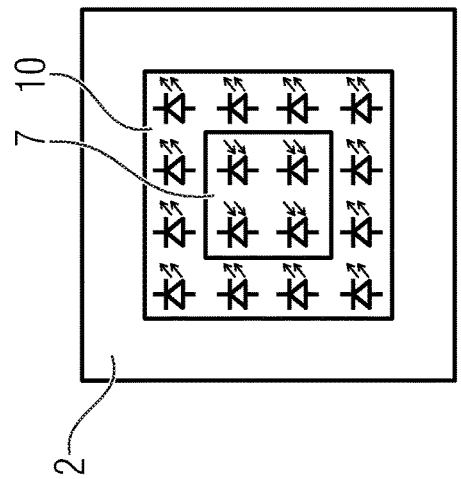
FIG. 11 shows a ninth embodiment of an inventive sensor device in a schematic top view.

FIG. 11 shows a ninth embodiment of an inventive sensor device 1 in a schematic top view. The photodiodes 7 and the light-emitting diodes 10 here are arranged in a common matrix such that the photodiodes 7 are arranged in an inner region of the common matrix and the light-emitting diodes 10 are arranged in an outer region of the common matrix. Exemplarily, a common 4×4 matrix is shown here, wherein larger matrices or a plurality of matrices may also be provided.

Figure 12:
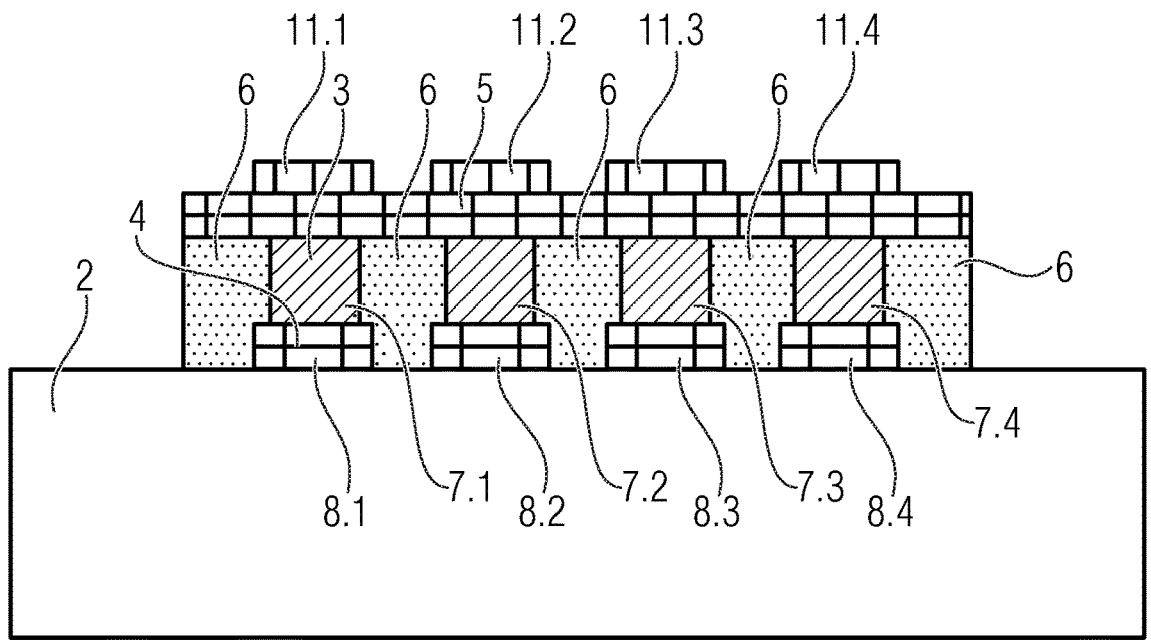
FIG. 12 shows a tenth embodiment of an inventive sensor device in a schematic side view.

FIG. 12 shows a tenth embodiment of an inventive sensor device 1 in a schematic side view. The embodiment of FIG. 12 is based on the embodiment of FIG. 1, which is why only the differences will be discussed below.

In accordance with a practical further development of the invention, the layers comprise one or several light-coupling layers 11 which are configured for improving the light-coupling efficiency when coupling light into one of the electrode layer 4, 5 and/or when coupling light out from one of the electrode layers 4, 5, wherein one of the light-coupling layers 11 is provided each on the side of the first electrode layer 4 facing away from the organic sensor layer 3 and/or the side of the second electrode layer 5 facing away from the organic sensor layer 3.

Thus, in the embodiment of FIG. 12, only one light-coupling layer 11 is provided at the second electrode layer 5. However, alternatively or additionally, a light-coupling layer 11 may be provided at the first electrode layer 4. The light-coupling layer 11 comprises segments 11.1 to 11.4, wherein each of these segments 11.1 to 11.4 is associated to precisely one of the sensor segments 7.1 to 7.4. The light-coupling layer 11, however, may also be formed over the entire area.

Figure 13:
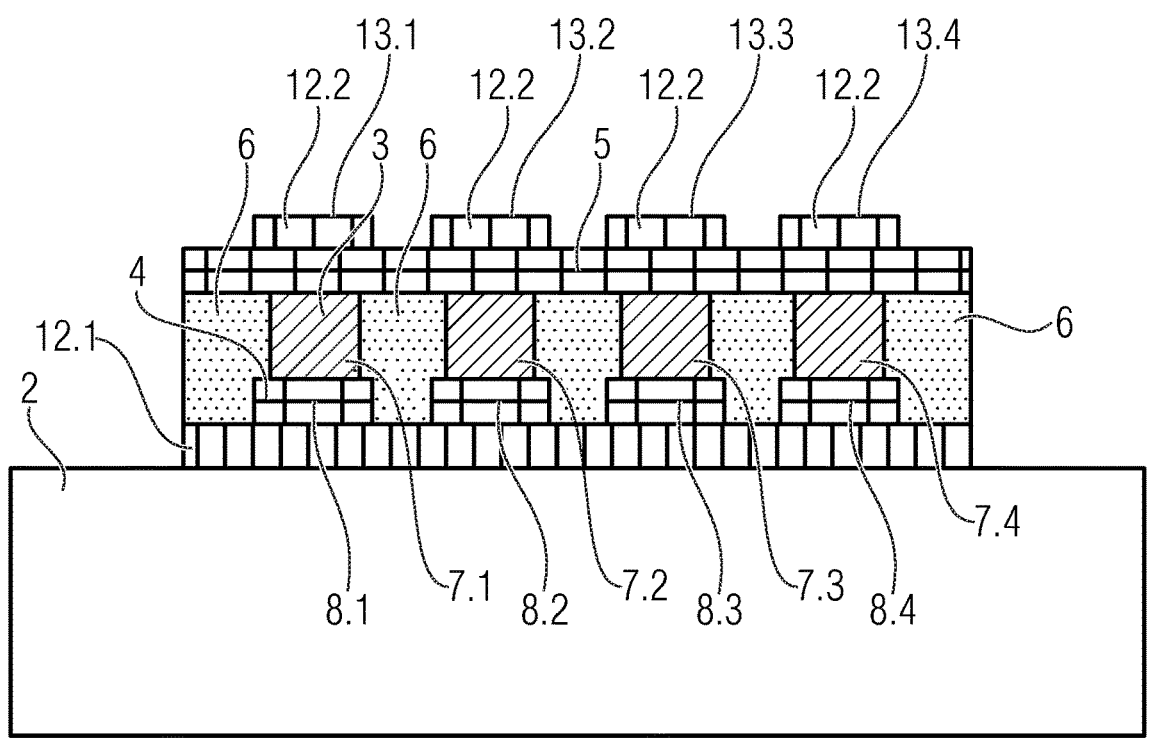
FIG. 13 shows an eleventh embodiment of an inventive sensor device in a schematic side view.

FIG. 13 shows an eleventh embodiment of an inventive sensor device 1 in a schematic side view. The embodiment of FIG. 12 is also based on the embodiment of FIG. 1, which is why only the differences will be described below.

In accordance with a further development of the invention, the layers comprise one or several filter layers 12 which are configured for spectrally filtering light when coupling light into one of the electrode layers 4, 5 and/or when coupling out light from one of the electrode layers, wherein one of the filter layers 12 is provided each on the side of the first electrode layer 4 facing away from the organic sensor layer 3 and/or on the side of the second electrode layer 5 facing away from the organic sensor layer 3.

In the embodiment of FIG. 13, a filter layer 12.1 is provided at the first electrode layer 4 and a filter layer 12.2 at the second electrode layer 5. However, embodiments wherein only one of the filter layers 12.1 and 12.2 is present are also conceivable.

In accordance with a further development of the invention, the one or several filter layers 12 are structured such that a plurality of filter segments 13 located horizontally next to one another are formed so that at least one of the filter segments 13 of the respective filter layer 12 is associated to each of the sensor segments 7, wherein a first group of the filter segments 13 of the respective filter layer 12 comprises a first spectral characteristic and a second group of the filter segments 13 of the respective filter layer 12 comprises a second spectral characteristic deviating from the first spectral characteristic.

In the embodiment of FIG. 13, the filter layer 12.2 is structured such that filter segments 13.1 to 13.4 are formed. Thus, the filter segments 13.1 to 13.4 may be associated to different groups of filter segments which comprise different spectral characteristics. The filter layer 12.1 in contrast is formed over the entire area.

Figure 14:
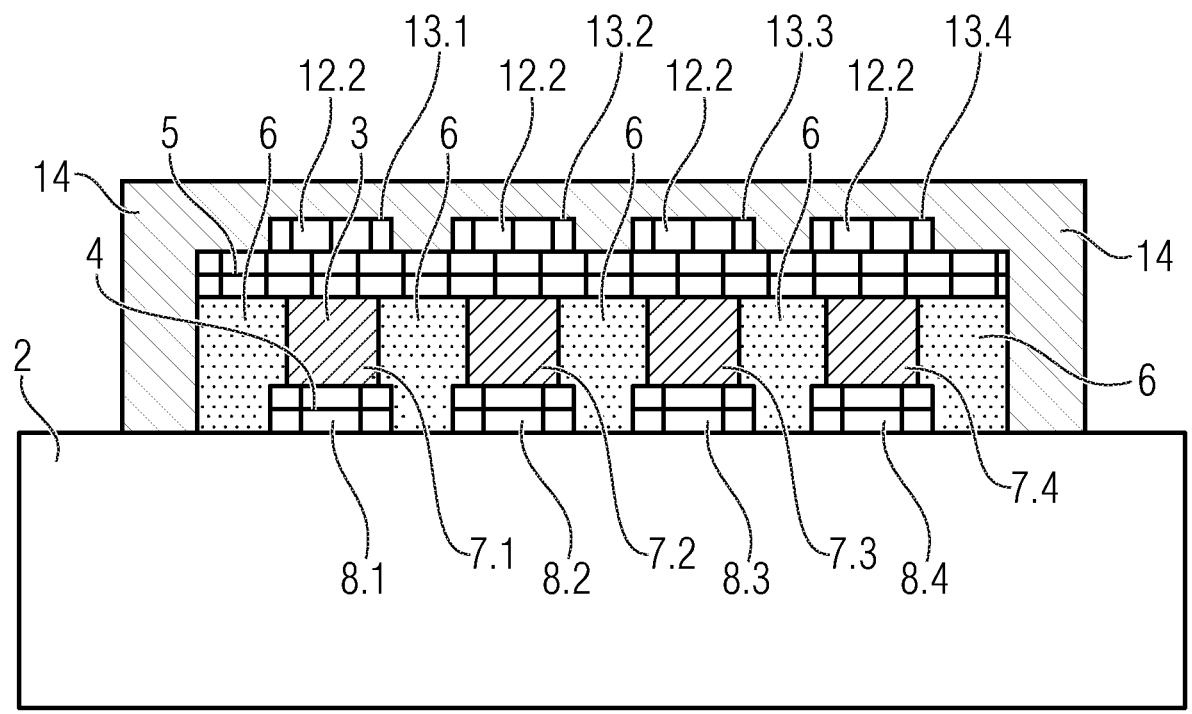
FIG. 14 shows a twelfth embodiment of an inventive sensor device in a schematic side view.

FIG. 14 shows a twelfth embodiment of an inventive sensor device 1 in a schematic side view. The embodiment of FIG. 14 is based on the embodiment of FIG. 13, which is why only the differences will be discussed below.

In accordance with an advantageous further development of the invention, a thin-film encapsulation 14 is provided for protecting at least a part of the layers from the effect of humidity.

In the embodiment of FIG. 14, the thin-film encapsulation 14 encloses all the layers arranged on the substrate layer 2, in cooperation with the substrate layer 2.

In accordance with an advantageous further development of the invention, as is shown in FIG. 14, the thin-film encapsulation 14 is formed for preventing horizontal penetration of liquid between at least some of the layers.

Figure 15:
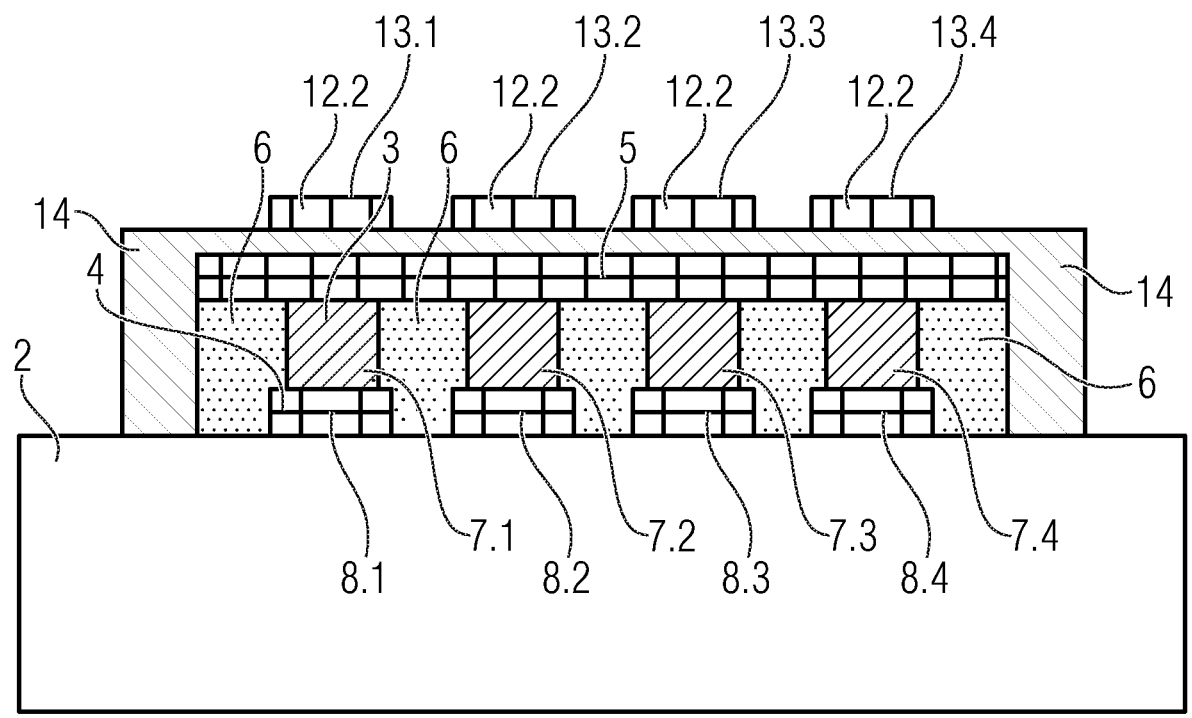
FIG. 15 shows a thirteenth embodiment of an inventive sensor device in a schematic side view.

FIG. 15 shows a thirteenth embodiment of an inventive sensor device 1 in a schematic side view. The embodiment of FIG. 15 is based on the embodiment of FIG. 14, which is why only the differences will be discussed below.

In contrast to FIG. 14, the filter layer 12.2 is arranged on the outside of the thin-film encapsulation 14.

FIGS. 16a-k show a method for manufacturing a microstructured organic sensor device 1 comprising layers oriented in parallel to one another, wherein the layers comprise a sensor layer 3 which is structured such that a plurality of horizontally spaced sensor segments 7 are formed, wherein each sensor segment 7 consists of one or several regions 9, in particular in accordance with any of claims 1-16, the method comprising the following steps in the following order:

a) providing a substrate layer 2 for supporting the further layers, wherein a first electrode layer 4 for contacting an organic sensor layer 3 is arranged at the substrate layer 2, for converting a technical quantity to be detected to an electrical quantity;

b) applying at least one organic sensor material layer SM over an entire area onto a compound made of the substrate layer 2 and the first electrode layer 4;

c) applying a first photoresist layer FL1 over an entire area onto the organic sensor material layer SM;

d) selectively exposing the first photoresist layer FL1 so that a first cured photoresist structure FH1 having horizontally spaced first cured photoresist structure elements FH1 and a first non-cured photoresist structure FN1 result;

e) removing the first non-cured photoresist structure FN1 by means of a first developing solvent;

f) applying a first solvent in order to remove a part of the at least one organic sensor material layer SM not covered by the first cured photoresist structure FH1 so that at least one of the regions 9 of the sensor segments 7 of the sensor layer 3 is formed each by a remaining part of the at least one organic sensor material layer SM so that each of the sensor segments 7 is contacted by the first electrode layer 4;

g) removing the first cured photoresist structure FH1 by means of a second solvent;

h) applying a second photoresist layer over an entire area onto the sensor segments 7 and onto gaps located horizontally between the sensor segments 7;

i) selectively exposing the second photoresist layer so that a second cured photoresist structure FH2 having horizontally spaced second cured photoresist structure segments FH2 and a second non-cured photoresist structure result, wherein at least one of the second cured photoresist structure segments FH2 is formed at each sensor segment 7;

j) removing the second non-cured photoresist structure by means of a second developing solvent;

k) applying a functional layer 6 over an entire area onto the sensor segments 7 having the second cured photoresist structure segments FH2 and the gaps located horizontally between the sensor segments 7;

l) applying a third photoresist layer over an entire area onto the functional layer 6;

m) selectively exposing the third photoresist layer so that a third cured photoresist layer FH3 and a third non-cured photoresist layer having horizontally spaced non-cured photoresist structure segments result, wherein one of the noncured photoresist structure segments of the third photoresist layer is associated to each of the second cured photoresist structure segments FH2;

n) removing the third non-cured photoresist structure by means of a third developing solvent;

o) applying a third solvent in order to remove a part of the functional layer 6 not covered by the third cured photoresist structure FH3 and the second cured photoresist structure segments FH2 so that the functional layer 6 is structured such that the gaps located horizontally between the sensor segments 7 are filled at least partly by the functional layer 6;

p) removing the third cured photoresist structure FH3 by means of a fourth solvent; and q) applying a second electrode layer 5 for contacting the organic sensor layer 3 over an entire area onto the sensor segments 7 and the functional layer 6 so that each of the sensor segments 7 is contacted by the second electrode layer 5;

wherein at least one of the electrode layers 4, 5 is structured such that a plurality of horizontally spaced electrode segments 8 are formed so that at least one of the electrode segments 6 of the respective electrode layer 4, 5 is associated to each of the sensor segments 7.

Figure 16A:
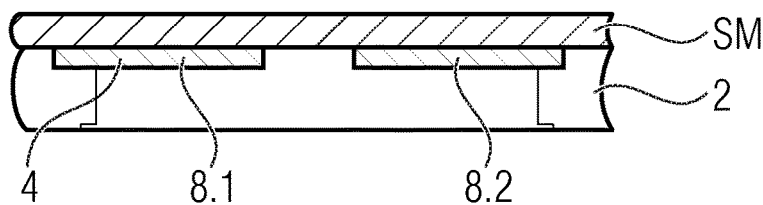
FIGS. 16a-k show a method for manufacturing an inventive sensor device.

The substrate layer 2 provided in step a) may be a wafer having integrated CMOS read-out electronics. In step b), the organic sensor material layer SM may be applied by means of spinning, slit nozzle deposition or spraying. The result of step b) is illustrated in FIG. 16a.

Figure 16B:
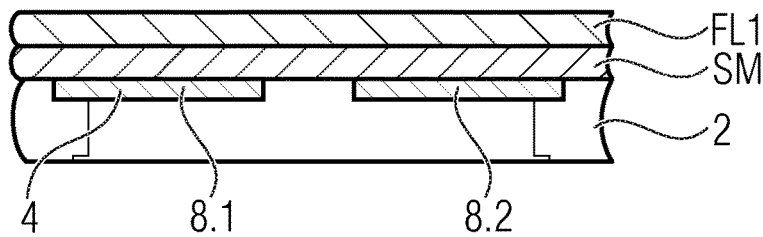
Figure 16C:
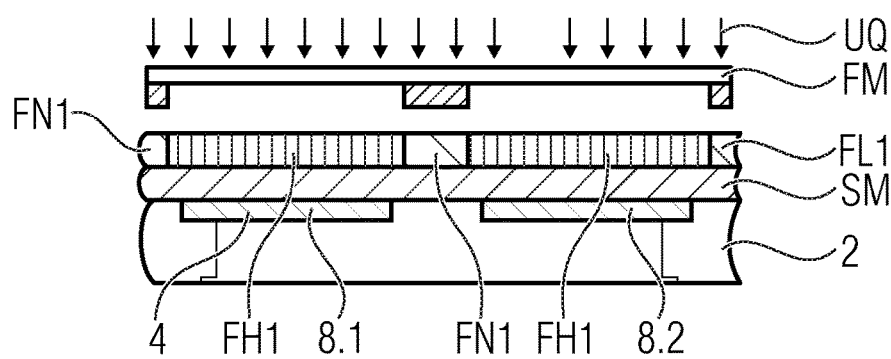
Figure 16D:
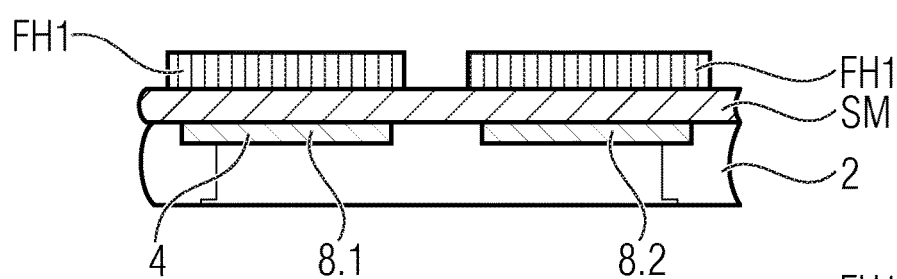
Figure 16E:
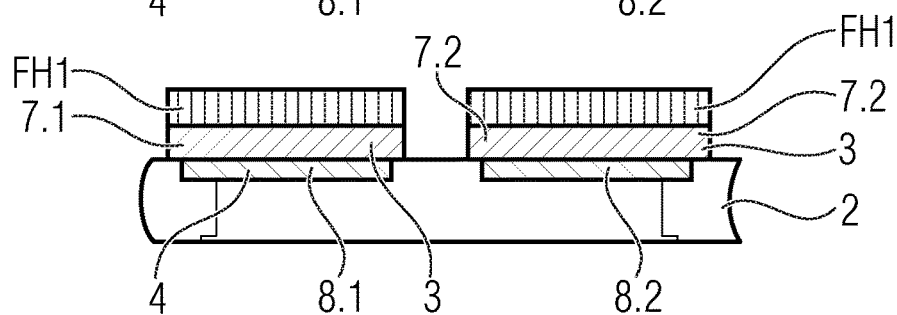

FIG. 16b shows the result of step c). Additionally, FIG. 16c illustrates step d) being performed. FIG. 16d shows step e) wherein a part of the first photoresist FL1, that is the first non-cured photoresist structure FN1, is removed by means of an etching process. Subsequently, as is shown in FIG. 16e, a part of the sensor material layer SM is removed according to step f) so that at least a part of the sensor layer 3, for example the sensor segments 7.1 and 7.2 horizontally spaced from each other, or a respective region 9 of the sensor segments 7.1 and 7.2 result. Steps b) to f) may be performed several times in order to produce sensor segments 7.1 and 7.2 which each comprise several regions 9 made of different sensor materials. Steps b) to f) may also be performed several times when sensor segments 7 having several regions 9 made of different sensor materials are to be produced.

Then, in accordance with step g), the first cured photoresist structure FH1 can be removed by means of a second solvent.

Figure 16F:
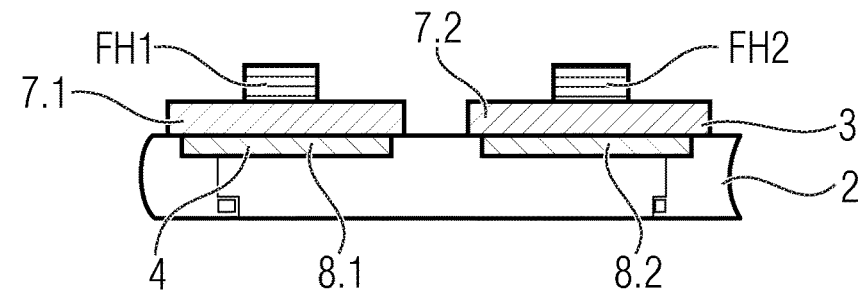

Additionally, in accordance with step h), applying a second photoresist layer over an entire area onto the sensor segments 7 and onto gaps located horizontally between the sensor segments 7 and, in accordance with step i), selectively exposing the second photoresist layer may be performed so that a second cured photoresist structure FH2 having horizontally spaced cured photoresist structure segments FH2 and a second non-cured photoresist structure result, wherein at least one cured photoresist structure segment FH2 is formed at each sensor segment 7. The result of these steps is illustrated in FIG. 16f.

Figure 16G:
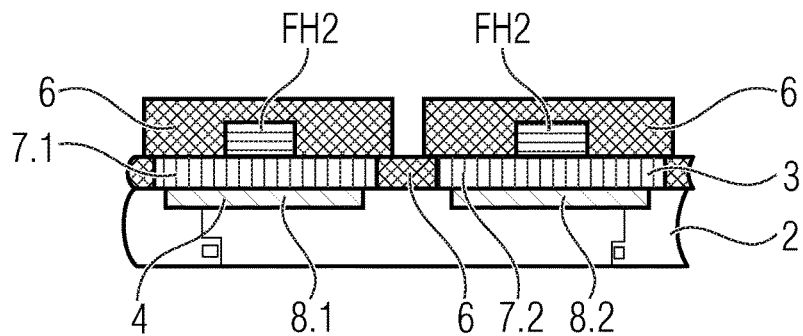

In accordance with step k), applying a functional layer 6 over an entire area onto the sensor segments 7, the second cured photoresist structure segments FH2 and the gaps located horizontally between the sensor segments 7 may be performed, which is illustrated in FIG. 16g. Thus, the sides, the edges or parts of the top side of the sensor segments 7.1 and 7.2 may be covered by the functional layer 6. The functional layer 6 may serve as a reflection or absorption layer.

Figure 16H:
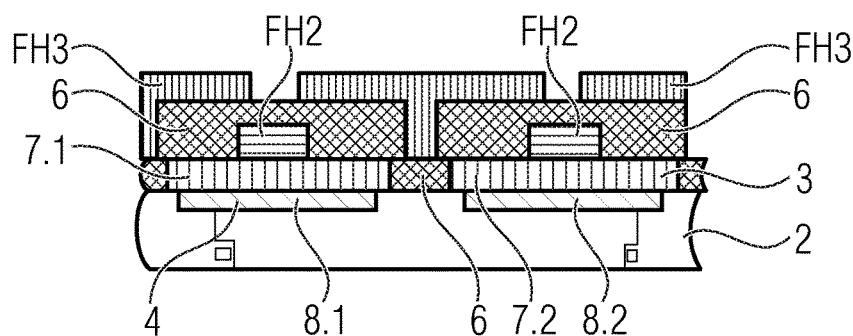

In FIG. 16*h*, what is illustrated is the result of steps of l) applying a third photoresist layer over an entire area onto the functional layer 6, m) selectively exposing the third photoresist layer so that a third cured photoresist structure FH3 and a third non-cured photoresist structure having horizontally spaced non-cured photoresist structure segments FH3 result, wherein one of the third non-cured photoresist structure segments FH3 is associated to each of the second cured photoresist structure segments FH2, and n) removing the third non-cured photoresist structure by means of a third developing solvent.

Figure 16I:
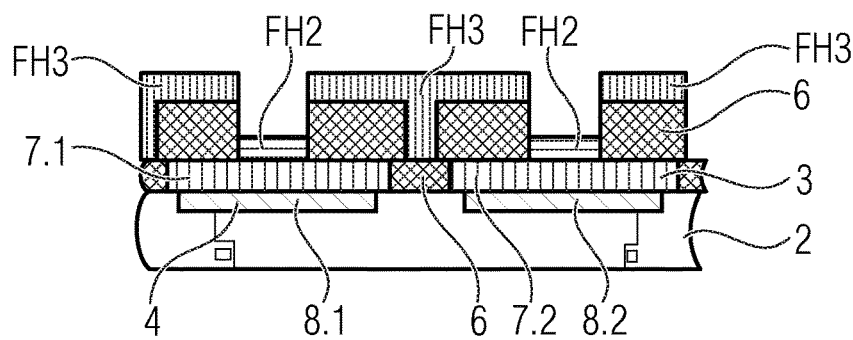

FIG. 16*i* shows the result of step o) of applying a third solvent in order to remove a part of the functional layer 6 not covered by the third cured photoresist structure FH3 and the second cured photoresist structure segments FH2 so that the functional layer 6 is structured such that the gaps located horizontally between the sensor segments 7 are filled at least partly.

Figure 16J:
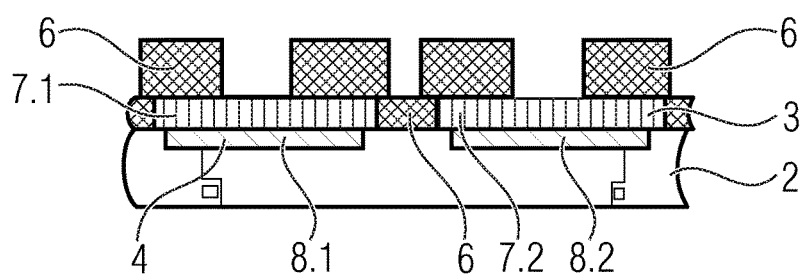

In addition, FIG. 16*j* shows the result of step p) of removing the third cured photoresist structure FH3 by means of a fourth solvent.

Figure 16K:
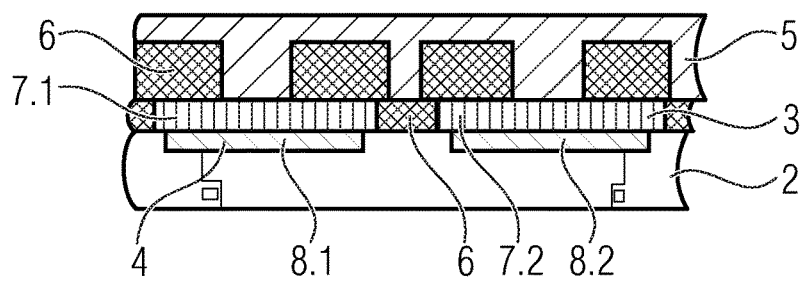

Furthermore, FIG. 16*k* shows the result of step q) of applying a second electrode layer 5 for contacting the organic sensor layer 3 over an entire area onto the sensor segments 7 and the functional layer 6, wherein each of the sensor segments 7 is contacted by the second electrode layer 5.

Steps a) to q) here are performed such that at least one of the electrode layers 4, 5 is structured such that a plurality of horizontally spaced electrode segments 8 are formed so that at least one of the electrode segments 8 of the respective electrode layer 4, 5 is associated to each of the sensor segments 7 and that the sensor layer 3 is structured such that a plurality of horizontally spaced sensor segments 7 are formed and each of the sensor segments 7 is contacted by the first electrode layer 4.

Then, depositing color filter layers and/or a thin-film encapsulation onto the sensor segments may take place, wherein the order may depend on the color filter material and deposition process.

FIGS. 17*a*-*m* show a further method for manufacturing a micro-structured organic sensor device 1 comprising layers oriented in parallel to one another, wherein the layers comprise a sensor layer 3 which is structured such that a plurality of horizontally spaced sensor segments 7 are formed, wherein each sensor segment 7 consists of one or several regions 9, in particular in accordance with any of claims 1-18, the method comprising the following steps in the following order:

a) providing a substrate layer 2 for supporting the further layers, wherein a first electrode layer 4 for contacting an organic sensor layer 3 is arranged at the substrate layer 2, for converting a technical quantity to be detected to an electrical quantity;

b) applying a first photoresist layer FL1 over an entire area onto a compound made of the substrate layer 2 and the first electrode layer 4;

c) selectively exposing the first photoresist layer FL1 so that a first cured photoresist structure FH1 and a first non-cured photoresist structure FN1 having first horizontally spaced cured photoresist structure segments FN1 are formed;

d) removing the first non-cured photoresist structure FN1 by means of a first developing solvent;

e) applying an organic sensor material layer SM over an entire area onto a compound made of the substrate layer 2, the first electrode layer 4 and the first cured photoresist structure FH1;

f) applying a first solvent in order to remove the first cured photoresist structure FH1 and the part of the organic sensor material layer SM arranged thereon so that at least one of the regions 9 of the sensor segments 7 of the sensor layer 3 is formed each by a remaining part of the at least one organic sensor material layer SM so that each of the sensor segments 7 is contacted by the first electrode layer 4;

g) applying a second photoresist layer FL2 over an entire area onto a compound made of the substrate layer 2, the first electrode layer 4 and the sensor segments 7;

h) selectively exposing the second photoresist layer FL2 so that a second cured photoresist structure FH2 having second horizontally spaced cured photoresist structure segments FH2 and a second non-cured photoresist structure FN2 result, wherein at least one cured photoresist structure segment FH2 of the second photoresist layer FL2 is formed at each sensor segment 7;

i) removing the second non-cured photoresist structure FN2 by means of a second developing solvent;

j) applying a functional layer 6 over an entire area onto the sensor segments 7 having the cured photoresist structure segments FH2 of the second photoresist layer FL2 and the gaps located horizontally between the sensor segments 7;

k) applying a second solvent in order to remove the second cured photoresist structure FH2 and the part of the functional layer 6 arranged thereon so that the functional layer 6 is structured such that the gaps located horizontally between the sensor segments 7 are filled at least partly by the functional layer 6; and l) applying a second electrode layer 5 for contacting the organic sensor layer 3 over an entire area onto the sensor segments 7 and the functional layer 6, wherein each of the sensor segments 7 is contacted by the second electrode layer 5;

wherein at least one of the electrode layers 4, 5 is structured such that a plurality of horizontally spaced electrode segments 8 are formed so that at least one of the electrode segments 8 of the respective electrode layer 4, 5 is associated to each of the sensor segments 7.

Figure 17A:
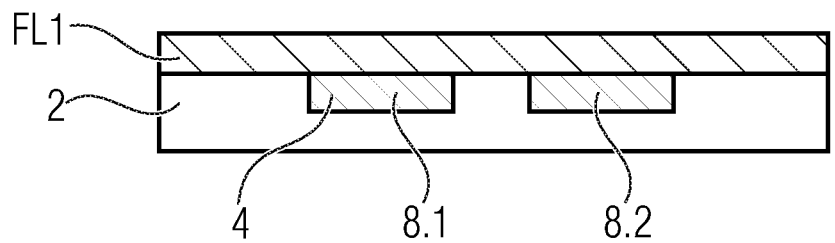
FIGS. 17a-m show another method for manufacturing an inventive sensor device.

The substrate layer 2 provided in step a) may be a wafer having integrated CMOS read-out electronics. In step b), the first photoresist layer FL1 may be applied onto the compound made of the substrate layer 2 and the first electrode layer 4. The result of step b) is illustrated in FIG. 17*a*.

Figure 17B:
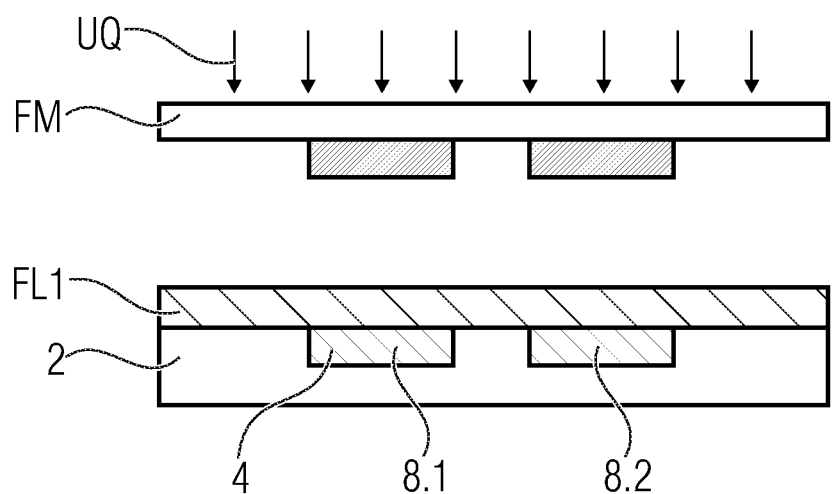
Figure 17C:
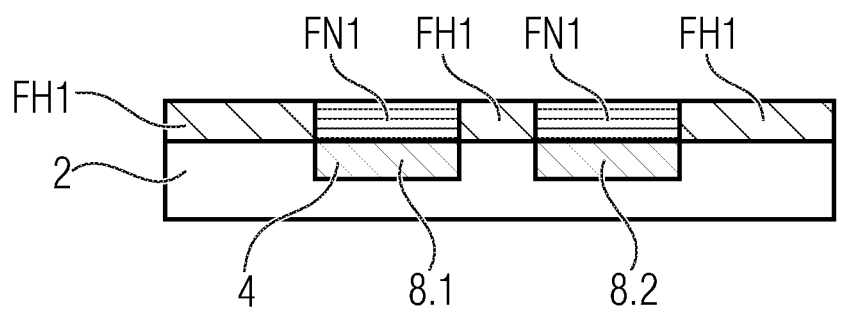

Exposing the first photoresist layer FL1 in accordance with step c) is shown in FIG. 17*b*, wherein the forming first cured photoresist structure FH1 and the forming first non-cured photoresist structure FN1 having the horizontally spaced cured photoresist structure segments FN1 are shown in FIG. 17*c*.

Figure 17D:
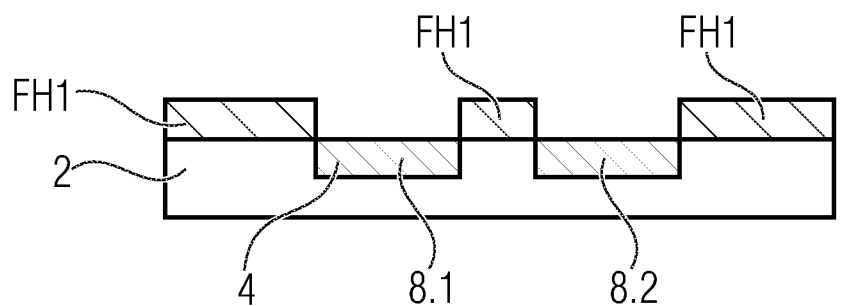
Figure 17E:
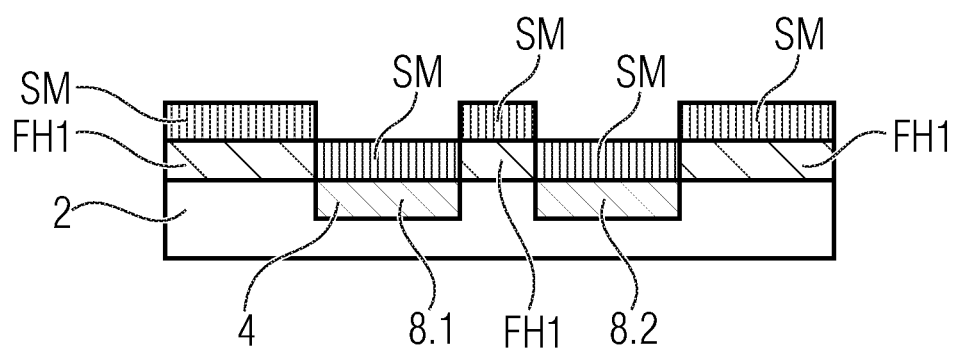

Additionally, FIG. 17*d* illustrates removing the first non-cured photoresist structure FN1 in accordance with step d). Applying an organic sensor material layer SM over an entire area onto a compound made of the substrate layer 2, the first electrode layer 4 and the first cured photoresist structure FH1 in accordance with step e) is illustrated in FIG. 17*e*.

Figure 17F:
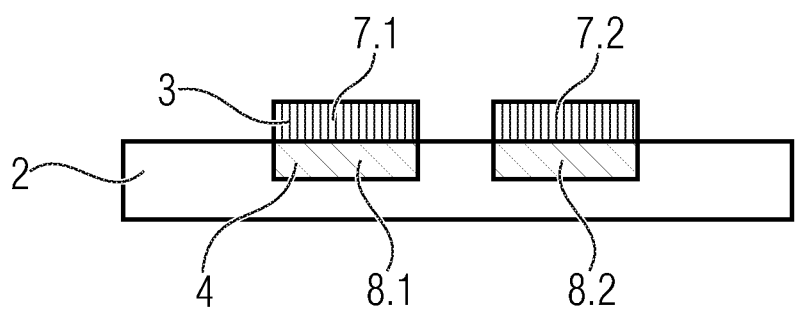

FIG. 17*f* illustrates how, in accordance with step f), after applying a first solvent, the first cured photoresist structure FH1 and the part of the organic sensor material layer SM arranged thereon are removed so that at least one of the regions 9 of the sensor segments 7 of the sensor layer 3 is formed each by a remaining part of the at least one organic sensor material layer SM, wherein each of the sensor segments 7 is contacted by the first electrode layer 4. Such a step where an underlying layer is dissolved by a solvent in order to detach an upper layer is frequently referred to as lift-off step.

Figure 17G:
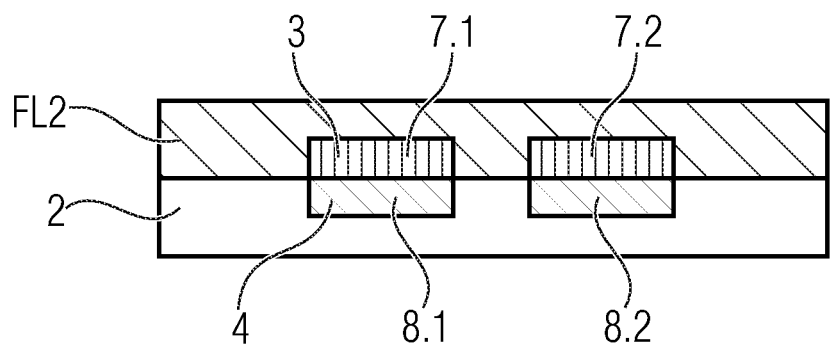
Figure 17H:
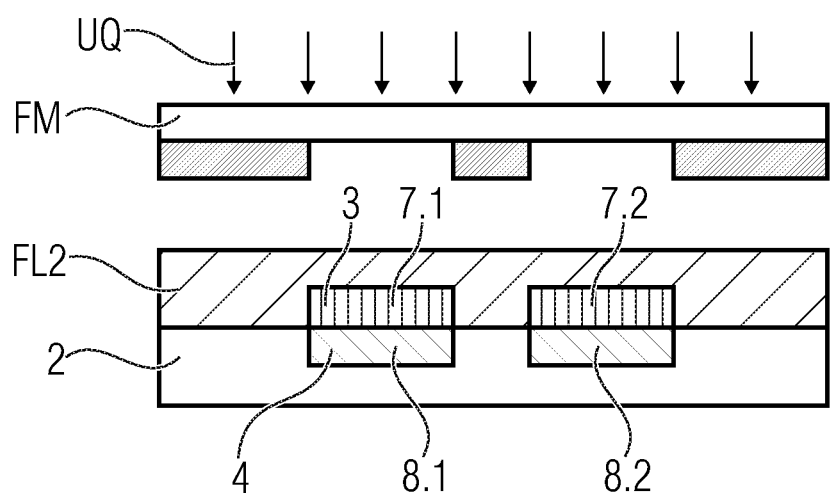
Figure 17I:
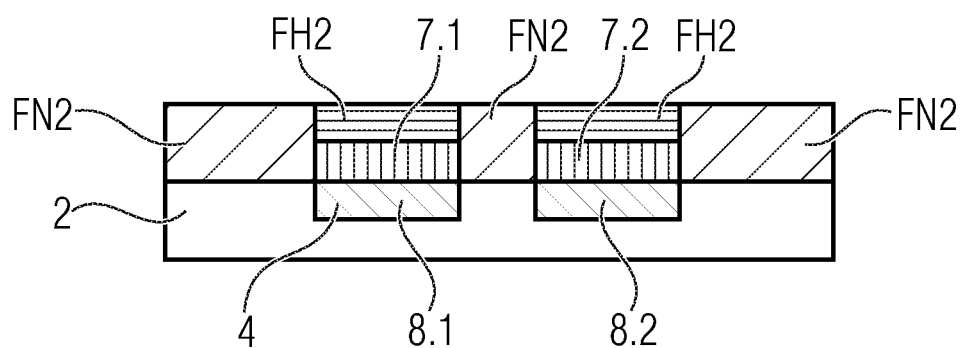

FIG. 17g shows the result of step g). Additionally, FIG. 17h shows selectively exposing the second photoresist layer FL2. Additionally, FIG. 17i shows forming the second cured photoresist structure FH2 and the second non-cured photoresist structure FN2 in accordance with step h).

Figure 17J:
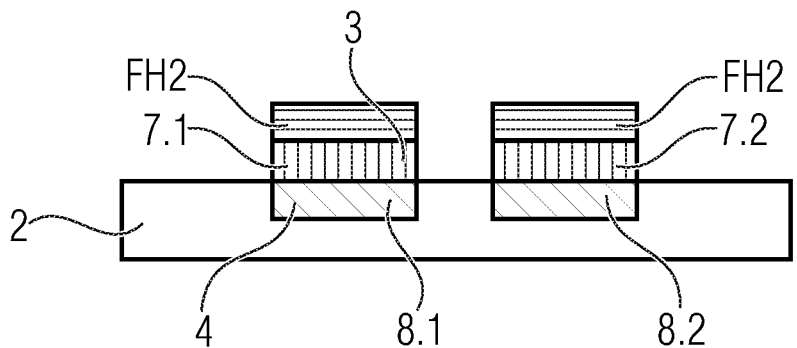

FIG. 17j illustrates removing the second non-cured photoresist structure FN2 by means of a second developing solvent in accordance with step i). Steps b) to i) can also be performed several times when sensor segments 7 having several regions 9 made of different sensor materials are to be produced.

Figure 17K:
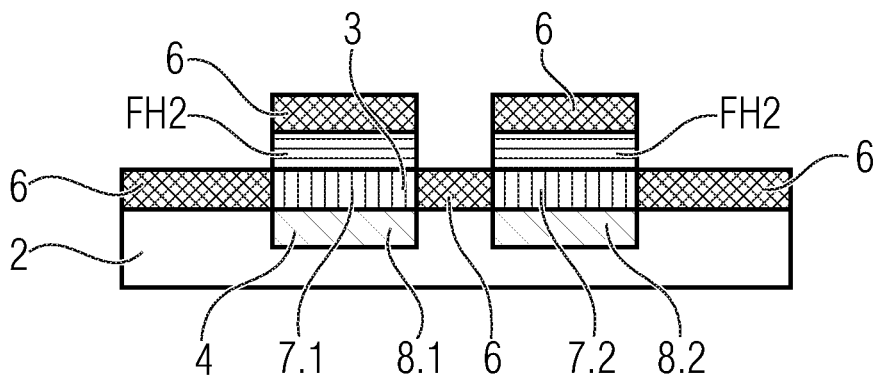

Additionally, FIG. 17k shows applying a functional layer 6 over an entire area onto the sensor segments 7 having the cured photoresist structure segments FH2 of the second photoresist layer FL2 and the gaps located horizontally between the sensor segments 7 in accordance with step j). Thus, the sides, edges and/or parts of the upper side of the sensor segments 7.1 and 7.2 can be covered by the functional layer 6. The functional layer 6 may serve as a reflection or absorption layer.

Figure 17L:
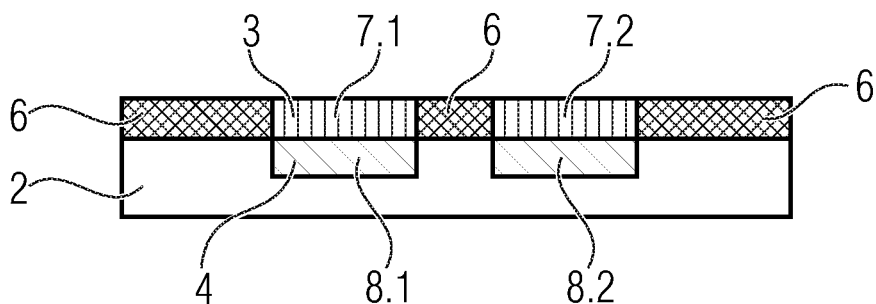

As is shown in FIG. 17l, in accordance with step k), the second solvent can then be applied in order to remove the second cured photoresist structure FH2 and the part of the functional layer 6 arranged thereon so that the functional layer 6 is structured such that the gaps located horizontally between the sensor segments 7 are at least partly filled by the functional layer 6.

Figure 17M:
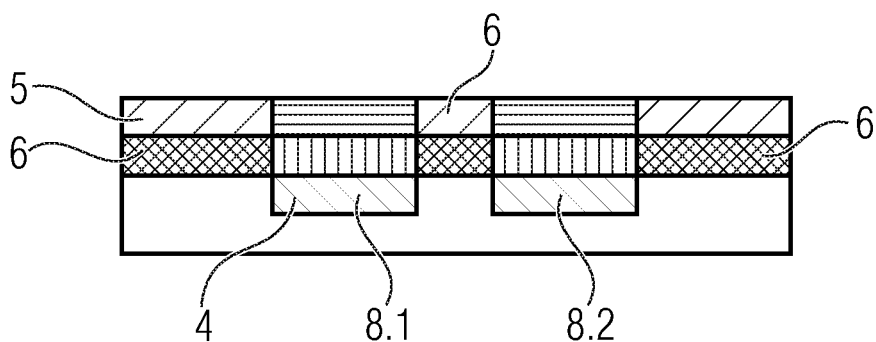

Furthermore, FIG. 17m illustrates, in accordance with step l), applying a second electrode layer 5 for contacting the organic sensor layer 3 over an entire area onto the sensor segments 7 and the functional layer 6, wherein each of the sensor segments 7 is contacted by the second electrode layer 5.

Steps a) to l) here are performed such that at least one of the electrode layers 4, 5 is structured such that a plurality of horizontally spaced electrode segments 8 are formed so that at least one of the electrode segments 8 of the respective electrode layer 4, 5 is associated to each of the sensor segments 7 and that the sensor layer 3 is structured such that a plurality of horizontally spaced sensor segments 7 are formed and that each of the sensor segments 7 is contacted by the first electrode layer 4.

Then, depositing color filter layers and/or a thin-film encapsulation onto the sensor segments may be performed, wherein the order may be dependent on the color filter material and depositing process.

Aspects of the invention having been described herein in the context of the inventive device also represent aspects of the inventive method. Conversely, such aspects of the invention having been described herein in the context of the inventive method also represent aspects of the inventive device.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A micro-structured organic sensor device comprising the following layers oriented in parallel to one another:
   a substrate layer for supporting the further layers;
   an organic sensor layer for converting a technical quantity to be detected to an electrical quantity;
   a first electrode layer for contacting the organic sensor layer on a side of the organic sensor layer facing the substrate layer;
   a second electrode layer for contacting the organic sensor layer on a side of the organic sensor layer facing away from the substrate layer; and
   one or several functional layers;
   wherein the sensor layer is structured such that a plurality of horizontally spaced sensor segments are formed;
   wherein at least one of the electrode layers is structured such that a plurality of horizontally spaced electrode segments are formed so that at least one of the electrode segments of the respective electrode layer is associated to each of the sensor segments; and
   wherein the one or several functional layers at least partly fill gaps located horizontally between the sensor segments; and
   wherein one or several light-emitting diodes is/are formed on the substrate layer.

2. The micro-structured organic sensor device in accordance with claim 1, wherein the sensor segments comprise a maximum horizontal extension of smaller than 50 µm.

3. The micro-structured organic sensor device in accordance with claim 1, wherein the one or several functional layers comprise a passivation layer.

4. The micro-structured organic sensor device in accordance with claim 1, wherein the organic sensor layer comprises several sub-sensor layers arranged in parallel to the other layers.

5. The micro-structured organic sensor device in according with claim 1, wherein the sensor segments are arranged in the style of a two-dimensional matrix.

6. The micro-structured organic sensor device in accordance with claim 1, wherein the first electrode layer and/or the second electrode layers is/are implemented as an organic layer, metal layer or metal-oxide multi-layer.

7. The micro-structured organic sensor device in accordance with claim 1, wherein the substrate layer is implemented as a glass layer, plastics layer or silicon layer.

8. The micro-structured organic sensor device in accordance with claim 1, wherein the sensor segments are optical sensor segments so that the micro-structured organic sensor device is a micro-structured optical organic sensor device.

9. The micro-structured organic sensor device in accordance with claim 1, wherein the first electrode layer and/or the second electrode layers is/are transparent or semi-transparent.

10. The micro-structured organic sensor device in accordance with claim 1, wherein a group of the sensor segments comprises a spectral sensitivity and at least one further group of the sensor segments comprises a spectral sensitivity deviating each from the spectral sensitivities of the other groups.

11. The micro-structured organic sensor device in accordance with claim 1, wherein the sensor segments comprise a region comprising a spectral sensitivity and at least one further region comprising a deviating spectral sensitivity.

12. The micro-structured organic sensor device in accordance with claim 1, wherein the layers comprise one or several light-coupling layers configured for improving the light-coupling efficiency when coupling light into one of the electrode layers and/or when coupling light out from one of the electrode layers, wherein one of the light-coupling layers is provided each on the side of the first electrode layer facing away from the organic sensor layer and/or the side of the second electrode layer facing away from the organic sensor layer.

13. The micro-structured organic sensor device in accordance with claim 1, wherein the layers comprise one or several filter layers configured for spectrally filtering light when coupling light into one of the electrode layers and/or when coupling light out from one of the electrode layers, wherein one of the filter layers is provided each on the side of the first electrode layer facing away from the organic sensor layer and/or on the side of the second electrode layer facing away from the organic sensor layer.

14. The micro-structured organic sensor device in accordance with claim 1, wherein the one or several filter layers is/are structured such that a plurality of filter segments located horizontally next to one another are formed so that at least one of the filter segments of the respective filter layer is associated to each of the sensor segments, wherein a first group of the filter segments of the respective filter layer comprises a first spectral characteristic and a second group of the filter segments of the respective filter layer comprises a second spectral characteristic deviating from the first spectral characteristic.

15. The micro-structured organic sensor device in accordance with claim 1, wherein a thin-film encapsulation is provided for protecting at least a part of the layers from the effect of humidity.

16. The micro-structured organic sensor device in accordance with claim 15, wherein the thin-film encapsulation is configured for preventing horizontal penetration of liquid between at least some of the layers.

17. The micro-structured organic sensor device in accordance with claim 1, wherein at least one of the layers is dried by flash-lamp annealing during manufacturing.

18. A method for manufacturing a micro-structured organic sensor device comprising layers oriented in parallel to one another, wherein the layers comprise a sensor layer which is structured such that a plurality of horizontally spaced sensor segments are formed, wherein each sensor segment comprises one or several regions, in particular in accordance with claim 1, the method comprising in the following order:
  a) providing a substrate layer for supporting the further layers, wherein a first electrode layer for contacting an organic sensor layer is arranged at the substrate layer, for converting a technical quantity to be detected to an electrical quantity;
  b) applying at least one organic sensor material layer over an entire area onto a compound made of the substrate layer and the first electrode layer;
  c) applying a first photoresist layer over an entire area onto the organic sensor material layer;
  d) selectively exposing the first photoresist layer so that a first cured photoresist structure comprising horizontally spaced first cured photoresist structure elements and a first non-cured photoresist structure result;
  e) removing the first non-cured photoresist structure by means of a first developing solvent;
  f) applying a first solvent in order to remove a part of the at least one organic sensor material layer not covered by the first cured photoresist structure so that at least one of the regions of the plurality of horizontally spaced sensor segments of the sensor layer is formed each by a remaining part of the at least one organic sensor material layer so that each of the sensor segments is contacted by the first electrode layer;
  g) removing the first cured photoresist structure by means of a second solvent;
  h) applying a second photoresist layer over an entire area onto the sensor segments and onto gaps located horizontally between the sensor segments;
  i) selectively exposing the second photoresist layer so that a second cured photoresist structure comprising horizontally spaced second cured photoresist structure segments and a second non-cured photoresist structure result, wherein at least one of the second cured photoresist structure segments is formed at each sensor segment;
  j) removing the second non-cured photoresist structure by means of a second developing solvent;
  k) applying a functional layer over an entire area onto the sensor segments comprising the second cured photoresist structure segments and the gaps located horizontally between the sensor segments;
  l) applying a third photoresist layer over an entire area onto the functional layer;
  m) selectively exposing the third photoresist layer so that a third cured photoresist structure and a third non-cured photoresist structure comprising horizontally spaced non-cured photoresist structure segments result, wherein one of the non-cured photoresist structure segments of the third photoresist layer is associated to each of the second cured photoresist structure segments;
  n) removing the third non-cured photoresist structure by means of a third developing solvent;
  o) applying a third solvent in order to remove a part of the functional layer not covered by the third cured photoresist structure and the second cured photoresist structure segments so that the functional layer is structured such that the gaps located horizontally between the sensor segments are filled at least partly by the functional layer;
  p) removing the third cured photoresist structure by means of a fourth solvent; and
  q) applying a second electrode layer for contacting the organic sensor layer over an entire area onto the sensor segments and the functional layer so that each of the sensor segments is contacted by the second electrode layer;
  wherein at least one of the electrode layers is structured such that a plurality of horizontally spaced electrode segments are formed so that at least one of the electrode segments of the respective electrode layer is associated to each of the sensor segments.

19. A method for manufacturing a micro-structured organic sensor device comprising layers oriented in parallel to one another, wherein the layers comprise a sensor layer which is structured such that a plurality of horizontally spaced sensor segments are formed, wherein each sensor segment comprises one or several regions, in particular in accordance with claim 1, the method comprising in the following order:
  a) providing a substrate layer for supporting the further layers, wherein a first electrode layer for contacting an organic sensor layer is arranged at the substrate layer, for converting a technical quantity to be detected to an electrical quantity;

b) applying a first photoresist layer over an entire area onto a compound made of the substrate layer and the first electrode layer;

c) selectively exposing the first photoresist layer so that a first cured photoresist structure and a first non-cured photoresist structure comprising first horizontally spaced cured photoresist structure segments are formed;

d) removing the first non-cured photoresist structure by means of a first developing solvent;

e) applying an organic sensor material layer over an entire area onto a compound made of the substrate layer, the first electrode layer and the first cured photoresist structure;

f) applying a first solvent in order to remove the first cured photoresist structure and the part of the organic sensor material layer arranged thereon so that at least one of the regions of the sensor segments of the sensor layer is formed each by a remaining part of the at least one organic sensor material layer so that each of the sensor segments is contacted by the first electrode layer;

g) applying a second photoresist layer over an entire area onto a compound made of the substrate layer, the first electrode layer and the sensor segments;

h) selectively exposing the second photoresist layer so that a second cured photoresist structure comprising second horizontally spaced cured photoresist structure segments and a second non-cured photoresist structure result, wherein at least one cured photoresist structure segment of the second photoresist layer is formed at each sensor segment;

i) removing the second non-cured photoresist structure by means of a second developing solvent;

j) applying a functional layer over an entire area onto the sensor segments comprising the cured photoresist structure segments of the second photoresist layer and the gaps located horizontally between the sensor segments;

k) applying a second solvent in order to remove the second cured photoresist structure and the part of the functional layer arranged thereon so that the functional layer is structured such that the gaps located horizontally between the sensor segments are filled at least partly by the functional layer; and l) applying a second electrode layer for contacting the organic sensor layer over an entire area onto the sensor segments and the functional layer, wherein each of the sensor segments is contacted by the second electrode layer;

wherein at least one of the electrode layers is structured such that a plurality of horizontally spaced electrode segments are formed so that at least one of the electrode segments of the respective electrode layer is associated to each of the sensor segments.

* * * * *